United States Patent
Nakamura et al.

(10) Patent No.: US 10,614,001 B1
(45) Date of Patent: Apr. 7, 2020

(54) MEMORY CONTROL METHOD, MEMORY CONTROL APPARATUS, AND IMAGE FORMING METHOD THAT USES MEMORY CONTROL METHOD

(71) Applicant: Kyocera Document Solutions Inc., Osaka (JP)

(72) Inventors: Masayoshi Nakamura, Torrance, CA (US); Dongpei Su, Palos Verdes Estates, CA (US)

(73) Assignee: Kyocera Document Solutions Inc., Osaka (JP)

( * ) Notice: Subject to any disclaimer, the term of this patent is extended or adjusted under 35 U.S.C. 154(b) by 0 days.

(21) Appl. No.: 16/528,455

(22) Filed: Jul. 31, 2019

Related U.S. Application Data

(63) Continuation-in-part of application No. 16/237,666, filed on Dec. 31, 2018, and a continuation-in-part of
(Continued)

(51) Int. Cl.
| | |
|---|---|
| *G06F 13/16* | (2006.01) |
| *H04N 1/32* | (2006.01) |
| *G06F 13/32* | (2006.01) |
| *G11C 11/409* | (2006.01) |
| *G06F 13/28* | (2006.01) |

(Continued)

(52) U.S. Cl.
CPC .......... *G06F 13/1668* (2013.01); *G06F 13/18* (2013.01); *G06F 13/28* (2013.01); *H04N 1/32368* (2013.01); *H04N 1/52* (2013.01); *G11C 11/4093* (2013.01); *G11C 11/4096* (2013.01)

(58) Field of Classification Search
USPC .......... 358/1.1–3.29, 1.11–1.18; 710/31–40, 710/44–48; 711/100–172
See application file for complete search history.

(56) References Cited

U.S. PATENT DOCUMENTS

| | | | | |
|---|---|---|---|---|
| 6,513,089 B1 * | 1/2003 | Hofmann | ................ | G06F 13/28 710/107 |
| 6,560,674 B1 * | 5/2003 | Hosogi | ............... | G06F 12/0833 711/118 |

(Continued)

FOREIGN PATENT DOCUMENTS

| | | |
|---|---|---|
| JP | 2007-072930 | 3/2007 |
| JP | 2010-134628 | 6/2010 |

*Primary Examiner* — Marcellus J Augustin
(74) *Attorney, Agent, or Firm* — James Judge

(57) ABSTRACT

A memory control method includes: attaching transfer IDs to generate write control data and attaching transfer IDs to generate read control data for respective predetermined areas; executing an arbitration that determines a priority order of processing taking the write control data and the read control data that are stored in an arbitration queue as targets; and adding a burst number of a Read command or a Write command to complete a transaction in response to an execution of an Activate command to execute the transaction while decrementing a burst number in response to an execution of the Read command or the Write command, so as to update a remaining burst number as a remaining number of bursts. The arbitration raises a priority order of the Activate command to execute a transaction having a large burst number when the remaining burst number is less than a preliminarily set threshold.

16 Claims, 22 Drawing Sheets

Related U.S. Application Data application No. 16/237,664, filed on Dec. 31, 2018, and a continuation-in-part of application No. 16/237,672, filed on Dec. 31, 2018, and a continuation-in-part of application No. 16/237,667, filed on Dec. 31, 2018.

(51) Int. Cl.
*G06F 13/18* (2006.01)
*H04N 1/52* (2006.01)
*G11C 11/4096* (2006.01)
*G11C 11/4093* (2006.01)

(56) References Cited

U.S. PATENT DOCUMENTS

| | | | |
|---|---|---|---|
| 7,966,431 B2 * | 6/2011 | Worrell | G06F 13/1605 710/22 |
| 8,285,914 B1 * | 10/2012 | Venkatramani | G06F 12/0607 711/158 |
| 2004/0107324 A1 | 6/2004 | Nystuen | |
| 2011/0302336 A1 * | 12/2011 | Naylor | G06F 13/1626 710/35 |
| 2015/0006807 A1 | 1/2015 | Chang et al. | |
| 2015/0199134 A1 | 7/2015 | Mondal et al. | |
| 2017/0255575 A1 | 9/2017 | Niu et al. | |

\* cited by examiner

In Processing

Next Processing Target Candidate

Pause-Off
 Pause-On

_US 10,614,001 B1_

MEMORY CONTROL METHOD, MEMORY CONTROL APPARATUS, AND IMAGE FORMING METHOD THAT USES MEMORY CONTROL METHOD

CROSS-REFERENCE TO RELATED APPLICATIONS

This application claims priorities of U.S. application Ser. No. 16/237,664, U.S. application Ser. No. 16/237,666, U.S. application Ser. No. 16/237,667, and U.S. application Ser. No. 16/237,672 filed on Dec. 31, 2018. These U.S. Applications are incorporated herein by reference.

BACKGROUND

Unless otherwise indicated herein, the description in this section is not prior art to the claims in this application and is not admitted to be prior art by inclusion in this section.

An image forming apparatus (for example, a printer, a multifunction printer, or a multi-functional peripheral (Multifunction Peripheral) has increasingly utilized a synchronous dynamic random-access memory (SDRAM) as a memory used for image processing and similar processing. The SDRAM includes high speed input/output interfaces. In recent years, further, realization of a double-data-rate synchronous dynamic random-access memory (DDR SDRAM) and introduction of an Advanced eXtensible Interface (AXI) as an interface specification have been increasingly accelerating the input/output interfaces.

SUMMARY

A memory control method according to one aspect of the disclosure controls a memory. The memory control method includes: receiving a write request data set and a read request data set, the write request data set including write data and requesting writing of data into the memory, the read request data set requesting reading of data from the memory, and transmitting read data that is read corresponding to the read request; dividing a write destination of the write data for respective predetermined areas in the memory and attaching transfer IDs to generate write control data for the respective predetermined areas by using the write request data set, and dividing a read destination of the read data for respective predetermined areas and attaching transfer IDs to generate read control data for the respective predetermined areas by using the read request data set; storing the write data temporarily in a write buffer; storing the write control data and the read control data in an arbitration queue; executing an arbitration that determines a priority order of processing taking the write control data and the read control data that are stored in the arbitration queue as targets; writing the write data stored in the write buffer into the memory by using the write control data selected based on the priority order, and generating a command to temporarily store read data read from the memory in a read buffer by using the read control data selected based on the priority order; and adding a burst number of a Read command or a Write command to complete a transaction in response to an execution of an Activate command to execute the transaction while decrementing a burst number in response to an execution of the Read command or the Write command, so as to update a remaining burst number as a remaining number of bursts. The arbitration raises a priority order of the Activate command to execute the transaction having a large burst number when the remaining burst number is less than a preliminarily set threshold.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Figure 1:
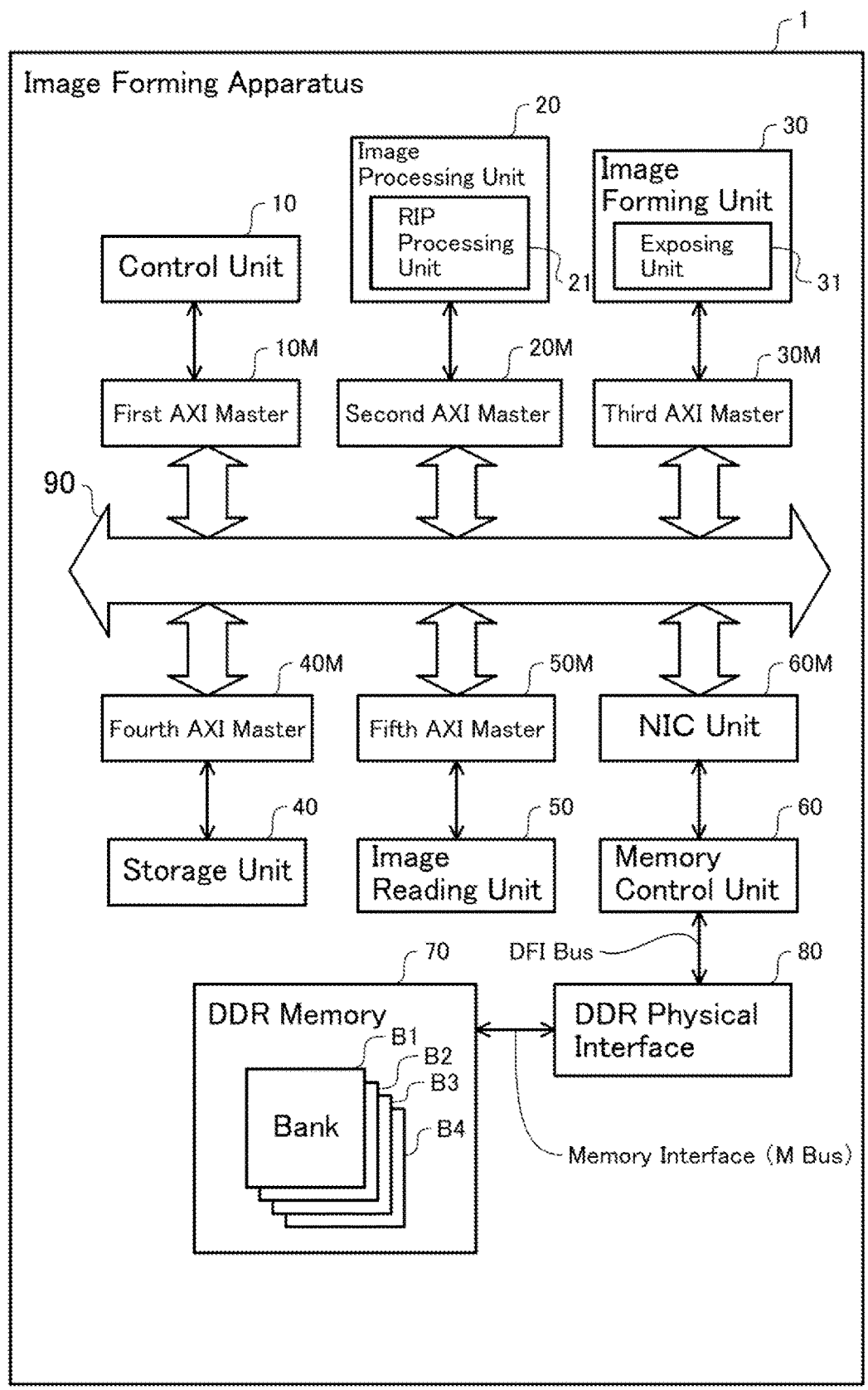
FIG. 1 is a block diagram illustrating a functional configuration of an image forming apparatus 1 according to first embodiment of the disclosure.

Example apparatuses are described herein. Other example embodiments or features may further be utilized, and other changes may be made, without departing from the spirit or scope of the subject matter presented herein. In the following detailed description, reference is made to the accompanying drawings, which form a part thereof.

The example embodiments described herein are not meant to be limiting. It will be readily understood that the aspects of the present disclosure, as generally described herein, and illustrated in the drawings, can be arranged, substituted, combined, separated, and designed in a wide variety of different configurations, all of which are explicitly contemplated herein.

An image forming apparatus has many functions and handles increased amount of data in association with high resolution, and may include large-capacity high-speed memories, such as DDR memory. The inventor has focused on a point that latency requirements in reading and writing of the high-speed memories are different depending on the functions, in consideration of such aspect, and has created a memory control technique having an efficient arbitration function in reading and writing for large-capacity high-speed memory. Especially, the inventor has created a processing procedure that ensures the efficient arbitration corresponding to a tFAW delay.

The following describes a configuration for implementing the disclosure (hereinafter referred to as an "embodiment") in the following order with reference to the drawings.

A. Functional Configuration of Image Forming Apparatus according to a first embodiment
B. Functional Configuration of Memory Control Unit according to the first embodiment
C. Inside-Bank Arbitration Processing Procedure according to the first embodiment
D. Data Read Processing Procedure according to the first embodiment
E. Data Write Processing Procedure according to the first embodiment
F. Functional Configuration of Image Forming Apparatus according to a second embodiment (Corresponding Processing Procedure in tFAW Delay)
G. Modification A. Functional Configuration of Image Forming Apparatus FIG. 1 is a block diagram illustrating a functional configuration of an image forming apparatus 1 according to first embodiment of the disclosure. The image forming apparatus 1 includes: a control unit 10; an image processing unit 20; an image forming unit 30; a storage unit 40; an image reading unit 50; a memory control unit 60; and an AXI bus 90 that mutually connects these units. The image forming apparatus 1 further includes a DDR memory 70, which is controlled by the memory control unit 60, and a DDR physical interface 80, which functions as a physical layer interface. The image processing unit 20 includes an RIP processing unit 21. The image forming unit 30 includes an exposing unit 31. The DDR memory 70 includes four banks, namely, a first bank B1, a second bank B2, a third bank B3, and a fourth bank B4.

The image forming apparatus 1 further includes: a first AXI master 10M that is connected to the control unit 10; a second AXI master 20M that is connected to the image processing unit 20; a third AXI master 30M that is connected to the image forming unit 30; a fourth AXI master 40M that is connected to the storage unit 40; a fifth AXI master 50M that is connected to the image reading unit 50; and a Network Interconnect unit (also referred to as an "NIC unit" such as an AMBA Network Interconnect) 60M that is connected to the memory control unit 60.

The first AXI master 10M, the second AXI master 20M, the third AXI master 30M, the fourth AXI master 40M, the fifth AXI master 50M, and the NIC unit 60M have a Direct Memory Access (DMA) control function, and each can use a plurality of AXI_IDs. However, in this embodiment, to promote an understanding of the description, it is assumed that the first AXI master 10M, the second AXI master 20M, the third AXI master 30M, the fourth AXI master 40M, the fifth AXI master 50M, and the NIC unit 60M each use one AXI_ID. The AXI_ID is also referred to as a "management ID."

The AXI bus 90 enables the respective units to communicate with one other in accordance with an AXI protocol. The AXI bus 90 supports a Quality of Service (QOS) value based on the AXI protocol. In this example, the QOS value represents a priority level of communication as 2-bit data of value 0 to 3. Specifically, for example, a QOS value 0 indicates permission of use of a dedicated band. A QOS value 1 indicates a high priority level, a QOS value 2 indicates a medium priority level, and a QOS value 3 indicates a low priority level. The QOS value is also referred to as "communication priority data."

The control unit 10 includes a processor such as a Micro Processing Unit (MPU) or a Central Processing Unit (CPU). The control unit 10 has a controller function related to interfaces such as various kinds of I/Os, a Universal Serial Bus (USB), a bus, and other hardware. The control unit 10 controls the whole image forming apparatus 1.

The storage unit 40 is a storage device configured of a hard disk drive, a flash memory, and similar memory, which are non-transitory storage media and stores control programs and data of processes each executed by the control unit 10.

The image reading unit 50 reads or scans an image from a document to generate image data as digital data. The image reading unit 50 can write the image data into the DDR memory 70 via the fifth AXI master 50M, the AXI bus 90, the NIC unit 60M, and the memory control unit 60 in this order. The fifth AXI master 50M functions as a master module of the NIC unit 60M. The NIC unit 60M functions as a slave module of the fifth AXI master 50M. The NIC unit 60M functions as the master module of the memory control unit 60. The memory control unit 60 functions as an AXI slave module of the NIC unit 60M.

The fifth AXI master 50M transmits a write request packet, which includes the image with an attached QOS value 0, to the AXI bus 90 by a DMA control function corresponding to an instruction from the control unit 10. The AXI bus 90 secures a bandwidth and latency corresponding to an instruction from the fifth AXI master 50M, and transmits a write request packet, which includes the image data as a write target and to which the QOS value 0 is attached, to the NIC unit 60M by using the bandwidth.

The NIC unit 60M writes the image data into the DDR memory 70 by using the memory control unit 60 corresponding to the write request packet. This enables the image reading unit 50 to write the image data into the DDR memory 70. The write request packet, which will be described later in detail, is also referred to as a "write request data set."

The image processing unit 20 can read the image data from the DDR memory 70 to receive the image data. Specifically, the second AXI master 20M transmits a read request data set, to which the QOS value 3 is attached, to the AXI bus 90 by the DMA control function corresponding to an instruction from the image processing unit 20. The AXI bus 90 transmits the read request data set, to which the QOS value 3 is attached, to the NIC unit 60M without using the bandwidth.

The NIC unit 60M, corresponding to the read request data set, reads the image data from the DDR memory 70 by using the memory control unit 60, and then transmits it to the AXI bus 90. The AXI bus 90 transmits a read data packet, which includes the image data, to the second AXI master 20M.

The raster image processor (RIP) processing unit 21 of the image processing unit 20 executes an RIP processing with respect to the image data received from the second AXI master 20M. This enables the RIP processing unit 21 to generate pixel data, which is pixel map data of respective colors. The RIP processing includes a color conversion processing and a halftone processing.

Subsequently, the image processing unit 20 can write the pixel data into the DDR memory 70 via the second AXI master 20M, the AXI bus 90, the NIC unit 60M, and the memory control unit 60 in this order. This enables the image forming apparatus 1 to temporarily save the pixel data.

The image forming unit 30, similarly to the image processing unit 20, can read the pixel data from the DDR memory 70 to receive the pixel data via the memory control unit 60, the NIC unit 60M, the AXI bus 90, and the third AXI master 30M in this order. However, the third AXI master 30M executes a read processing from the DDR memory 70 by using the QOS value 0.

The exposing unit 31 of the image forming unit 30 executes the halftone processing on the pixel data of the respective colors to generate dot data. The dot data is data for representing dot formation states formed on a print medium by use of color materials. The exposing unit 31 can execute an exposure processing with respect to development drums (not illustrated) of the respective colors based on the dot data. Following the exposure processing, the image forming unit 30 can execute a development processing and a fixing processing to execute an image formation processing.

The AXI bus 90 supports the quality-of-service (QOS) value based on the AXI protocol. The AXI bus 90 can execute a band control and a priority control for transmitting and receiving of the image data and the pixel data by using the QOS value. This enables the image forming apparatus 1 to ensure efficient and reliable internal communication.

Specifically, when the fifth AXI master 50M writes the image data into the DDR memory 70 at a time of image reading, the fifth AXI master 50M can cause the AXI bus 90 to secure the bandwidth and latency for transmitting the image data to the DDR memory 70 from the image reading unit 50. This enables the image forming apparatus 1 to transmit the image data by using the bandwidth, and thus ensures elimination of data disposal (data missing) caused by an excessive transmission delay of the image data, which is sequentially generated in an image reading processing.

Meanwhile, when the image processing unit 20 receives the image data after reading it from the DDR memory 70 at a time of image processing, occasional slow down of the image processing unit 20 is not disastrous. This is because the image data is stored in the DDR memory 70 and thus the image data is not lost even there is an excessive transmission delay of the image data. Also when the image processing unit 20 writes the pixel data into the DDR memory 70 after the image processing, the image processing unit 20 does not need to cause the AXI bus 90 to secure the bandwidth and latency.

In contrast, when the control unit 10 transmits the pixel data to the exposing unit 31 of the image forming unit 30 after reading it from the DDR memory 70 at a time of image formation, the control unit 10 is desired to deliver the pixel data at a fixed rate, which means an appropriate right latency. This enables the image forming apparatus 1 to transmit the pixel data by using the bandwidth, and thus ensures elimination of dot omission (image missing) caused by an excessive transmission delay of the pixel data, which is sequentially required for the exposing unit 31 in the image formation processing.

Thus, in the communication between the memory control unit 60 and other units (namely, the control unit 10, the image processing unit 20, the image forming unit 30, the storage unit 40, and the image reading unit 50), the image forming apparatus 1 ensures the efficient and reliable internal communication by using the QOS value.

However, the inventor has focused on a fact that a priority control or similar control has not been sufficiently examined on an internal processing of the memory control unit 60. In consideration of demands for capacity enlargement of the memory, which is a control target of the memory control unit 60, and for acceleration of read/write speed, the inventor has examined on efficiency of the internal processing of the memory control unit 60.

B. Functional Configuration of Memory Control Unit

Figure 2:
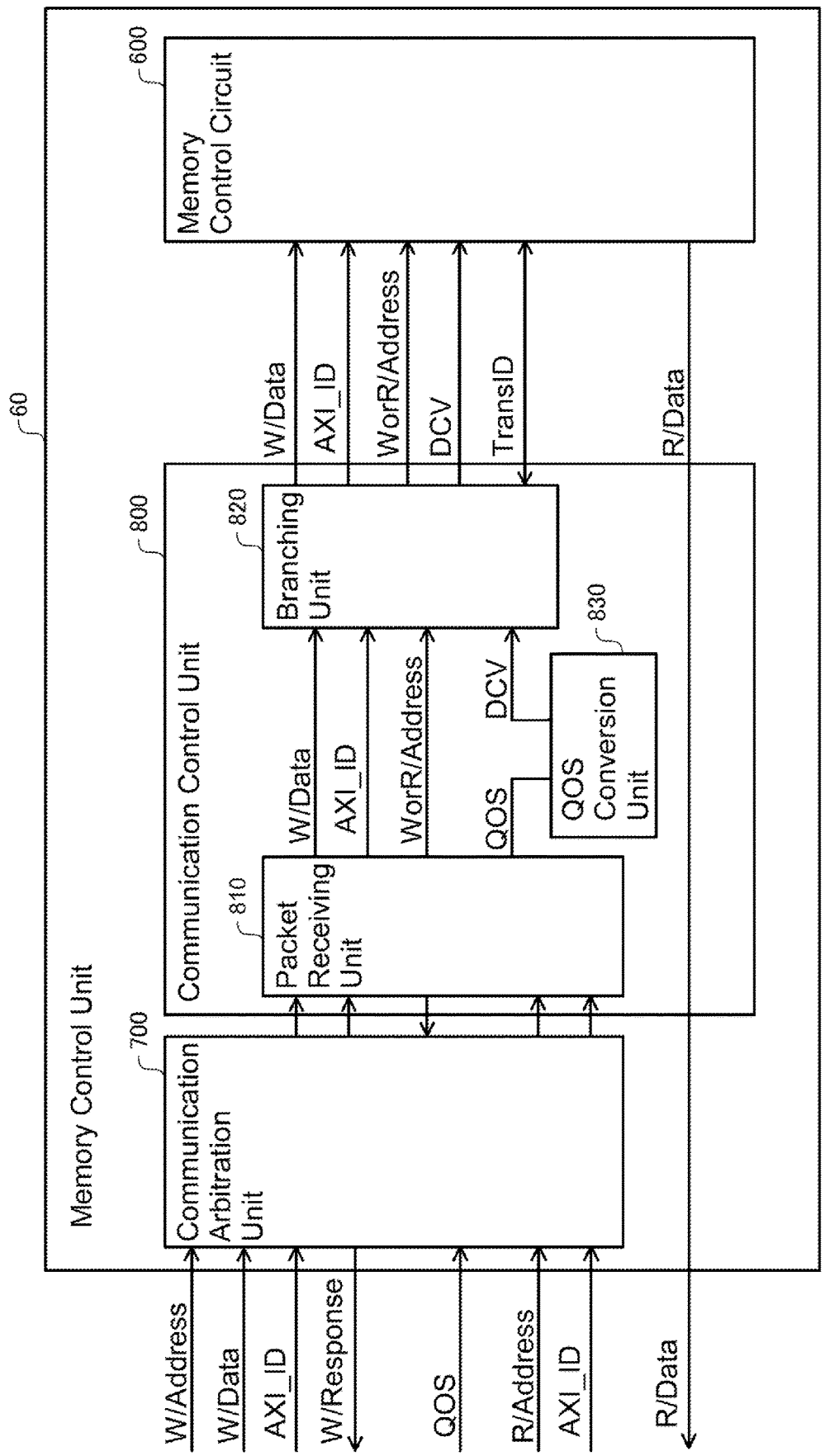
FIG. 2 is a block diagram illustrating a functional configuration of a memory control unit 60 according to the first embodiment.

FIG. 2 is a block diagram illustrating a functional configuration of the memory control unit 60 according to the first embodiment. The memory control unit 60 includes a communication arbitration unit 700, a communication control unit 800, and a memory control circuit 600. The memory control unit 60 controls writing of data into the DDR memory 70 and reading of data from the DDR memory 70. In this example, the memory control unit 60 communicates with the NIC unit 60M by using a read address channel (R/Address) and a read data channel (R/Data) for reading, and by using a write address channel (W/Address), a write data channel (W/Data), and a write response channel (W/Response) for writing, based on an AXI specification. The following describes a processing that writes the image data into the DDR memory 70 from the image reading unit 50 as a first example.

In the processing that writes the image data, the memory control unit 60 communicates with the NIC unit 60M by using the write address channel (W/Address), the write data channel (W/Data), and the write response channel (W/Response). Specifically, the memory control unit 60 receives control data in a form like a packet (also referred to as a "control packet") by using the write address channel (W/Address), receives the image data in a form like a packet (also referred to as a "data packet") by using the write data channel (W/Data), and transmits a write response signal to the NIC unit 60M by using the write response channel (W/Response) corresponding to receiving of the last packet of the image data. The control data includes an address, the QOS value, and an AXI_ID. The write request packet is a combination of the control data transmitted using the write address channel (W/Address) and the image data transmitted using the write data channel (W/Data), and is also referred to as the write request data set.

The communication arbitration unit 700 executes a communication arbitration between a write request of data into the DDR memory 70 and a read request of data from the DDR memory 70. This is because writing of data and reading of data into/from the DDR memory 70 cannot be simultaneously executed, while, since the NIC unit 60M separately arbitrates the write request and the read request, the memory control unit 60 may simultaneously receive the write request packet and a read request packet. This enables the memory control unit 60 to simultaneously receive the write request packet and the read request packet from the NIC unit 60M while controlling the DDR memory 70 that cannot simultaneously execute writing of data and reading of data.

The communication control unit 800 includes a packet receiving unit 810, a branching unit 820, and a QOS conversion unit 830. The packet receiving unit 810 receives the packet from the communication arbitration unit 700 to transmit the control data and the write data to the branching unit 820. Furthermore, the packet receiving unit 810 extracts the QOS value from the control packet to transmit it to the QOS conversion unit 830. The QOS conversion unit 830 is also referred to as a "processing priority data generating unit." The communication control unit 800 is also simply referred to as a "transmitting/receiving unit."

The QOS conversion unit 830 converts the QOS value having values of 0 to 3 into an in-memory cycle value (also simply referred to as a "Due Cycle Value" (DCV value)). Specifically, by using a preliminarily prepared table (not illustrated), the QOS conversion unit 830 converts the QOS values of 0 to 3 into DCV values (initial values) of 150, 200, 250, and 300, respectively. It is preferable that the table is set such that the QOS value with a higher priority level can be converted into a smaller DCV value by using, for example, simulation, corresponding to a priority of the QOS value as allowable latency requirements of a particular QOS. The DCV value is also referred to as "processing priority data."

When the branching unit 820 determines that the processing is a processing across a plurality of banks (described below, and also referred to as "predetermined areas") or a plurality of Rows (also referred to as "rows and predetermined areas") after analyzing the addresses included in the control packet, the branching unit 820 divides it into transactions T for the respective banks and the respective Rows. Each transaction T stores the AXI_ID, a write address, the write data, and a transfer ID (supplied from a write buffer control unit 611 described later), or the AXI_ID, a read address, and a transfer ID (supplied from a read buffer control unit 612 described later). The write address is data where a write flag is on in address data (WorR/Address). Furthermore, the branching unit 820 associates an identical DCV value with the AXI_ID of each transaction T to transmit it to the memory control circuit 600.

Figure 3:
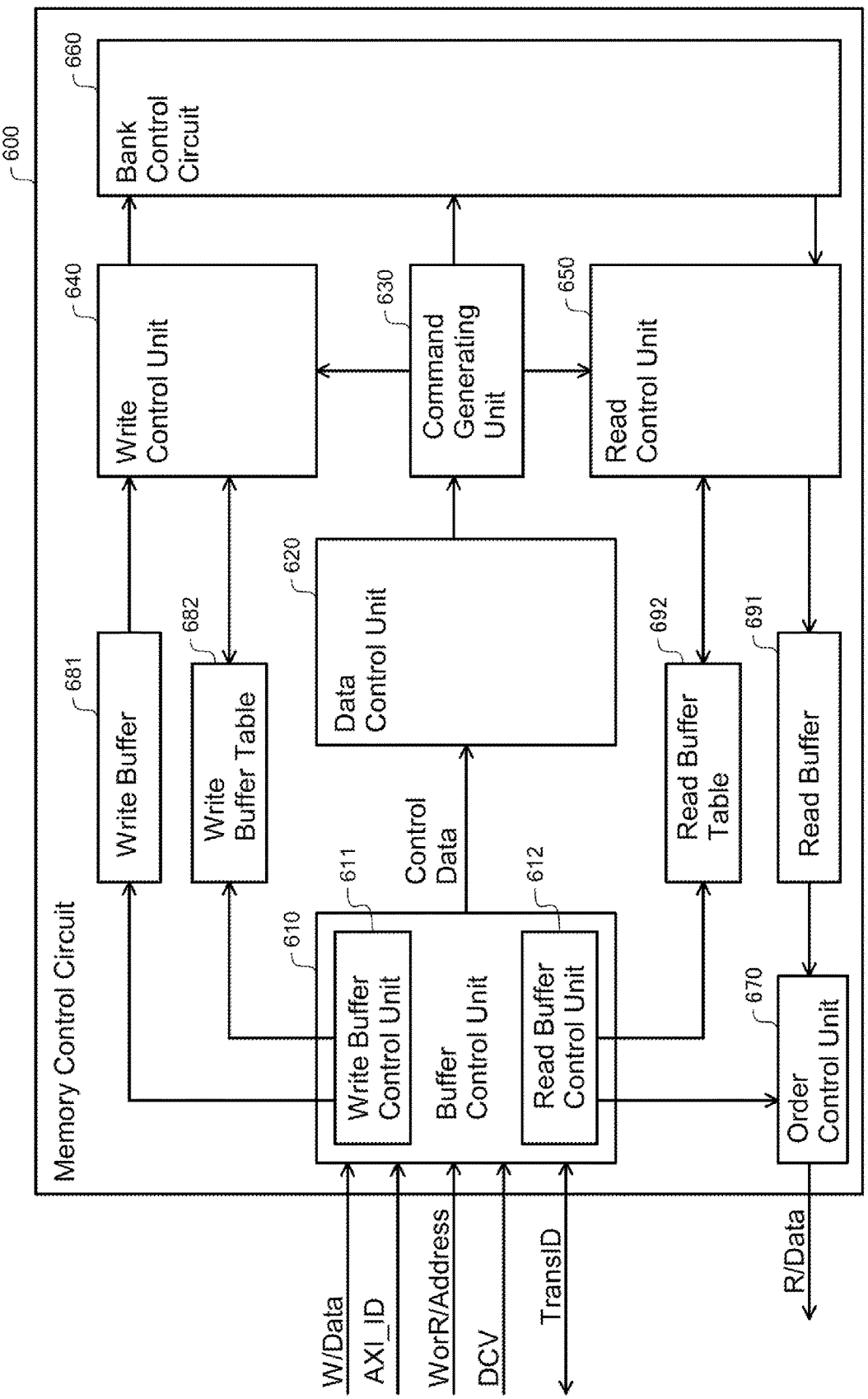
FIG. 3 is a block diagram illustrating a functional configuration of a memory control circuit 600 according to the first embodiment.

FIG. 3 is a block diagram illustrating a functional configuration of the memory control circuit 600 according to the first embodiment. The memory control circuit 600 includes a buffer control unit 610, a data control unit 620, a command generating unit 630, a write control unit 640, a read control unit 650, a bank control circuit 660, an order control unit 670, a write buffer 681, a write buffer table 682, a read buffer 691, and a read buffer table 692. The buffer control unit 610 includes the write buffer control unit 611 and the read buffer control unit 612. The write buffer 681 and the read buffer 691 are also simply referred to as "buffers." The transaction T includes a write transaction T and a read transaction T.

The write buffer control unit 611 manages a transfer ID (WtransID) for write processing to supply it to the branching unit 820. Specifically, the write buffer control unit 611 assigns a vacant transfer ID for each of the write transactions T, and assigns storage areas into the write buffer 681 to record information representing the assigned areas in association with the transfer IDs, in the write buffer table 682. The write buffer control unit 611 sequentially writes the write data that comes from the write data channel (W/Data) of the AXI master into the assigned storage area. The write control unit 640 reads the write data from inside the write buffer 681, and then, releases the transfer ID after the write data has been transferred to the DDR memory 70 via the bank control circuit 660.

The read buffer control unit 612 manages a transfer ID (RtransID) for read processing to supply it to the branching unit 820. Specifically, the read buffer control unit 612 assigns a vacant transfer ID for each of the read transactions T, and assigns storage areas into the read buffer 691 to record information representing the assigned areas in association with the transfer IDs, in the read buffer table 692. The read control unit 650 writes the read data read from the DDR memory 70 into the assigned read buffer. The read control unit 650 reads the read data from inside the read buffer 691, and then, releases the transfer ID after outputting it to the AXI master with the read data channel of the AXI via the order control unit 670.

The buffer control unit 610 receives and analyzes the respective transactions T. The write buffer control unit 611 transmits the write data to the write buffer 681 to temporarily store it in respective areas of the write buffer 681 until writing into the DDR memory 70. The write buffer control unit 611 stores an in-buffer address that identifies a storage area of the write data inside the write buffer 681 in the write buffer table 682 in association with a transfer ID. Meanwhile, the buffer control unit 610 transmits the control data (including the address and the DCV value) in the respective transactions T to the data control unit 620.

Figure 4:
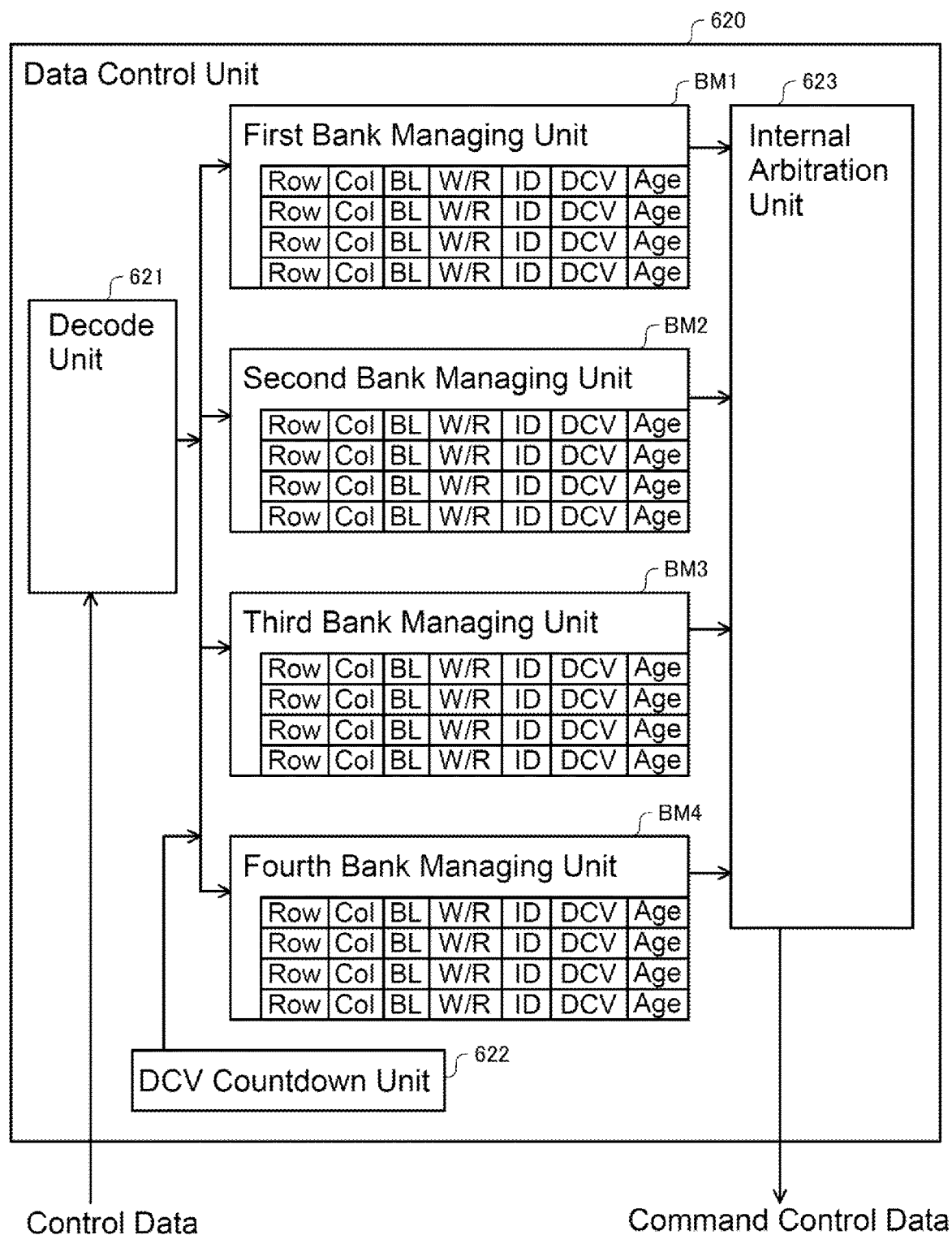
FIG. 4 is a block diagram illustrating a functional configuration of a data control unit 620 according to the first embodiment.

FIG. 4 is a block diagram illustrating a functional configuration of the data control unit 620 according to the first embodiment. The data control unit 620 includes a decode unit 621, a DCV countdown unit 622, an internal arbitration unit 623 (also simply referred to as an "arbitration unit"), a first bank managing unit BM1, a second bank managing unit BM2, a third bank managing unit BM3, and a fourth bank managing unit BM4. The first bank managing unit BM1 to the fourth bank managing unit BM4 are also simply referred to as "arbitration queues" or "inside-bank arbitration queues." The DCV countdown unit 622 is also referred to as a "change processing unit."

The first bank managing unit BM1, the second bank managing unit BM2, the third bank managing unit BM3, and the fourth bank managing unit BM4 each function as the arbitration queue. The first bank managing unit BM1, the second bank managing unit BM2, the third bank managing unit BM3, and the fourth bank managing unit BM4 are used for management (control) of reading and writing of the first bank B1, the second bank B2, the third bank B3, and the fourth bank B4 of the DDR memory 70, respectively. The first bank managing unit BM1 to the fourth bank managing unit BM4 are shared in a read processing and a write processing together with the internal arbitration unit 623. The DDR memory 70 shares an internal data bus (not illustrated) in reading and writing. Thus, the data control unit 620 cannot simultaneously execute the write processing and the read processing. The data control unit 620 discriminates between the write processing and the read processing, and processes them using an identical logic to ensure a flexible arbitration.

By decoding the control data received from the buffer control unit 610, the decode unit 621 selects any one of the first bank managing unit BM1, the second bank managing unit BM2, the third bank managing unit BM3, and the fourth bank managing unit BM4 based on the address stored in the control data. In this example, it is assumed that the first bank managing unit BM1 is selected.

By decoding the control data, the decode unit 621 further obtains Row information, Col information, BL information (burst number information), W/R information, ID information, and the DCV value. The Row information indicates row information on a read/write destination of the data. The Col information indicates column information on the read/write destination of the data. The BL information is information that represents a burst length, that is, the number of bursts (for example, four or eight). In other words, the BL information corresponds to the number of Read/Write commands required for completing the transaction T in one activation. The W/R information is information that represents any one of writing and reading. The ID information indicates the transfer ID of the transaction T and is associated with the write data inside the write buffer 681 via the write buffer table 682, or the read data inside the read buffer 691 via the read buffer table 692.

The decode unit 621, as the decoded control data, saves the Row information, the Col information, the BL information, the W/R information, the ID information, and the DCV value in the selected first bank managing unit BM1, together with Age information. The Age information is a parameter that indicates the order in which the above-described plurality of pieces of information have been saved in the first bank managing unit BM1 to the fourth bank managing unit BM4. The control data where the W/R information represents the writing is also referred to as "write control data." The control data where the W/R information represents the reading is also referred to as "read control data."

Figure 5:
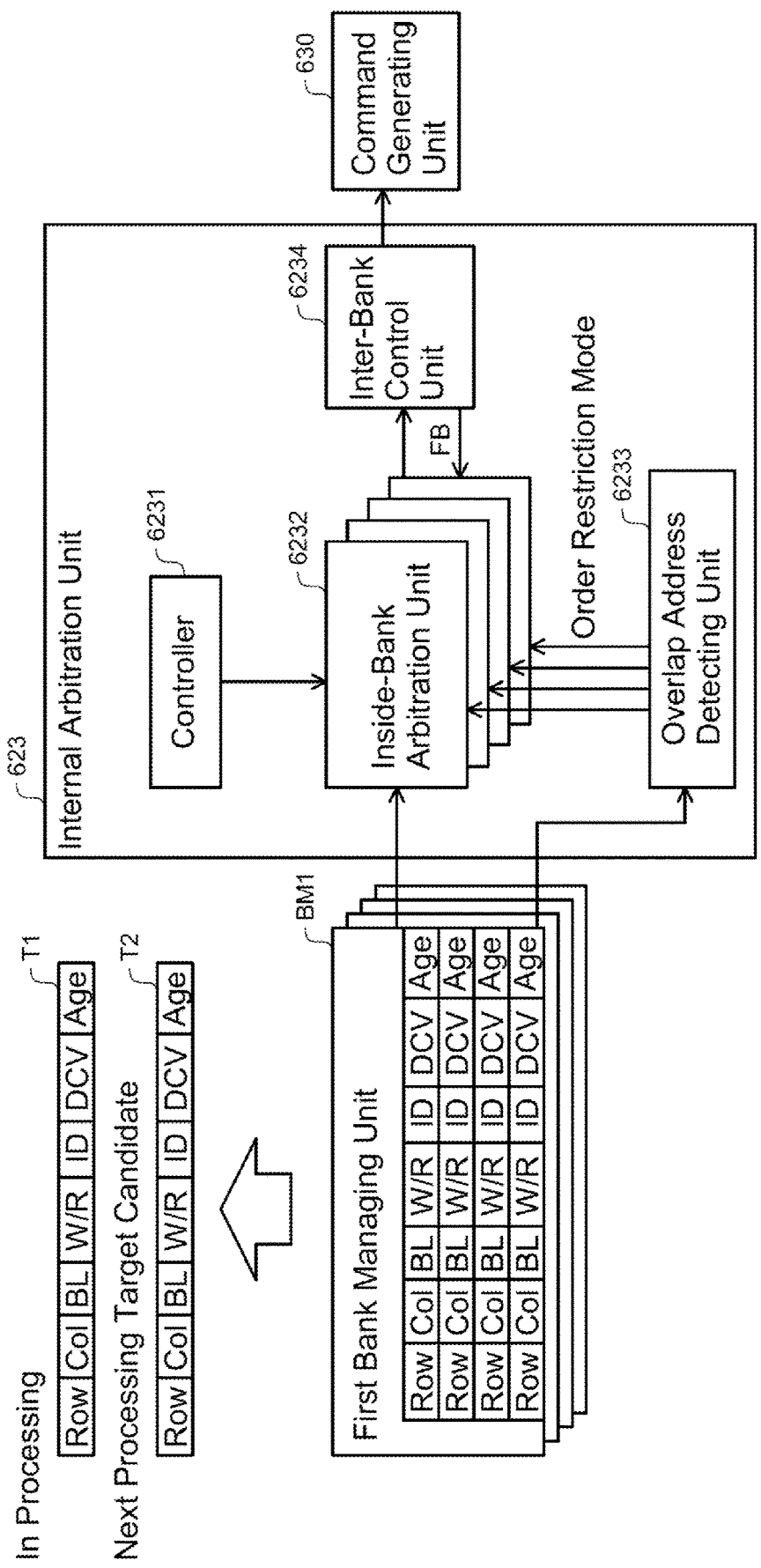
FIG. 5 is a block diagram illustrating a functional configuration of an internal arbitration unit 623 according to the first embodiment.

FIG. 5 is a block diagram illustrating a functional configuration of the internal arbitration unit 623 according to the first embodiment. The internal arbitration unit 623 includes: a controller 6231 that controls the whole internal arbitration unit 623; four inside-bank arbitration units 6232; an overlap address detecting unit 6233; and an inter-bank control unit 6234. The controller 6231 controls the inside-bank arbitration unit 6232, the overlap address detecting unit 6233, and the inter-bank control unit 6234.

The respective four inside-bank arbitration units 6232 execute the arbitration of the write request and the read request inside any bank (an identical bank) of the first bank B1, the second bank B2, the third bank B3, and the fourth bank B4, considering a control direction status. Specifically, for example, it is assumed that the control direction status is the write processing. In this case, when there is one write processing and one read processing with respect to the first bank B1, the inside-bank arbitration unit 6232 for the first bank B1 selects the write processing. When there is only the read processing with respect to the second bank B2, the inside-bank arbitration unit 6232 for the second bank B2 selects the read processing. When there is only the write processing with respect to the third bank B3, the inside-bank arbitration unit 6232 for the third bank B3 selects the write processing. When there is one processing for each of the write processing and the read processing with respect to the fourth bank B4, the inside-bank arbitration unit 6232 for the fourth bank B4 selects the write processing. The detail of this process will be described later.

The four inside-bank arbitration units 6232 transmit arbitration results inside the respective banks to the inter-bank control unit 6234. In this example, the inter-bank control unit 6234 receives the three write processings and the one read processing, and maintains the control direction status at the write processing. Such processing will decrease a request ratio of the write processing and increase a request ratio of the read processing with respect to the first bank B1, the second bank B2, the third bank B3, and the fourth bank B4. This makes the inter-bank control unit 6234 naturally switch the control direction status to the read processing, corresponding to the increase of the request ratio of the read processing. Such a selection reduces the switch of the control direction status.

The overlap address detecting unit 6233 detects a transaction T requesting an access to an address identical to that of the newly saved transaction T, among a plurality of transactions T saved in the first bank managing unit BM1 to the fourth bank managing unit BM4. The overlap address detecting unit 6233 identifies a plurality of transactions T (also referred to as "dependency transactions" or "dependency control data") requesting the access to the identical address to notify the respective inside-bank arbitration units 6232 of them. The inside-bank arbitration unit 6232 performs a transition of a processing mode to an order restriction mode by banks corresponding to this notice. The detail of the order restriction mode will be described later (see FIG. 14 to FIG. 16). Dependency transactions are transactions to be processed in FIFO regardless of their priorities.

Figure 6:
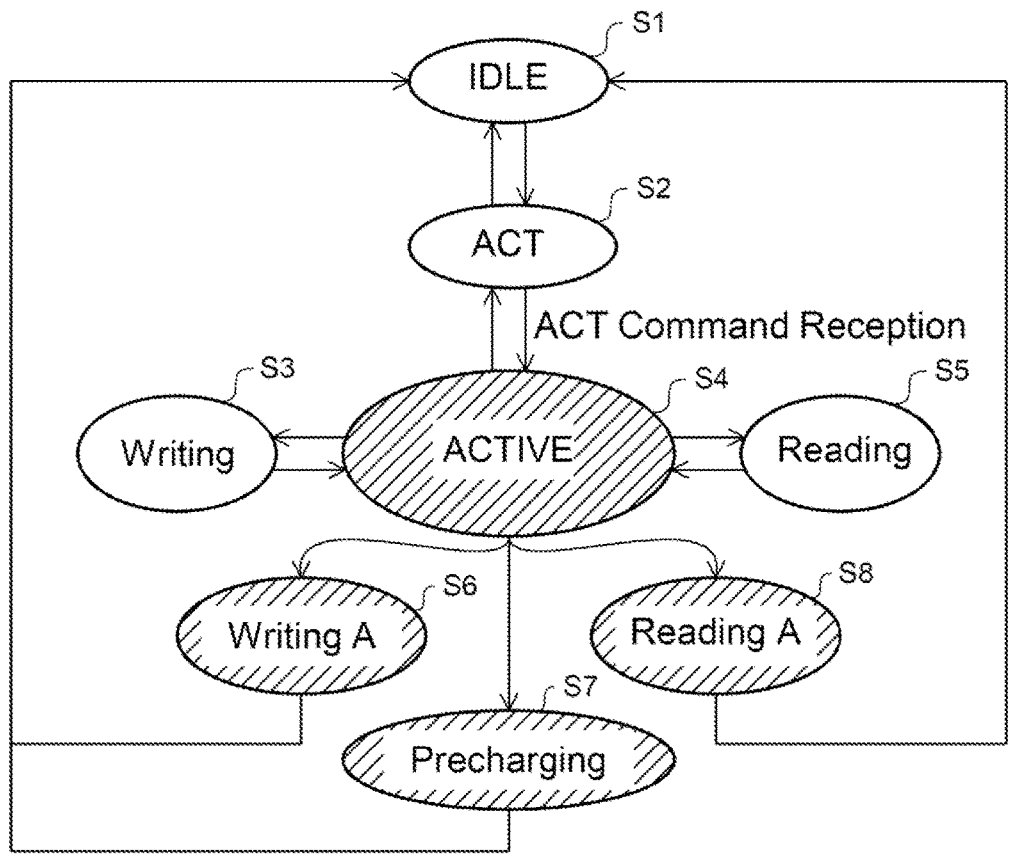
FIG. 6 is a state transition diagram of a command request of an inside-bank arbitration unit according to the first embodiment.
Figure 6:
Figure 6:
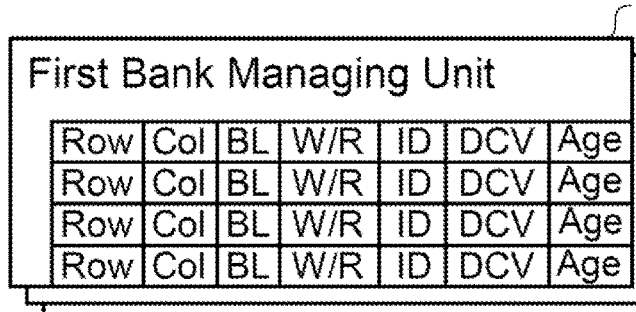

FIG. 6 is a state transition diagram of a command request of the inside-bank arbitration unit 6232 according to the first embodiment. The first bank B1 to the fourth bank B4 of the DDR memory 70 have eight states including an IDLE state S1, an ACT state S2, a Writing state S3, an ACTIVE state S4, a Reading state S5, a Writing A state S6, a Precharging state S7, and a Reading A state S8. The Writing A state S6 is a state to automatically execute Writing and then Precharging. The Reading A state S8 is a state to automatically execute Reading and then Precharging.

The inside-bank arbitration unit 6232 performs a state transition using the following four elements. The first element is a constraint of timing related to the DDR memory 70 such as tRC and tRP. The second element is a Grant signal indicating that the request transmitted by the inside-bank arbitration unit 6232 has been accepted as the arbitration result at the inter-bank control unit 6234. The third element is the state of a plurality of transactions T saved in the arbitration queue. Specifically, it is whether the selected transaction T is the last burst. The fourth element is a feedback FB from the inter-bank control unit 6234. The feedback FB indicates whether the memory control circuit 600 is in a write state or a read state.

C. Inside-Bank Arbitration Processing Procedure

Figure 7:
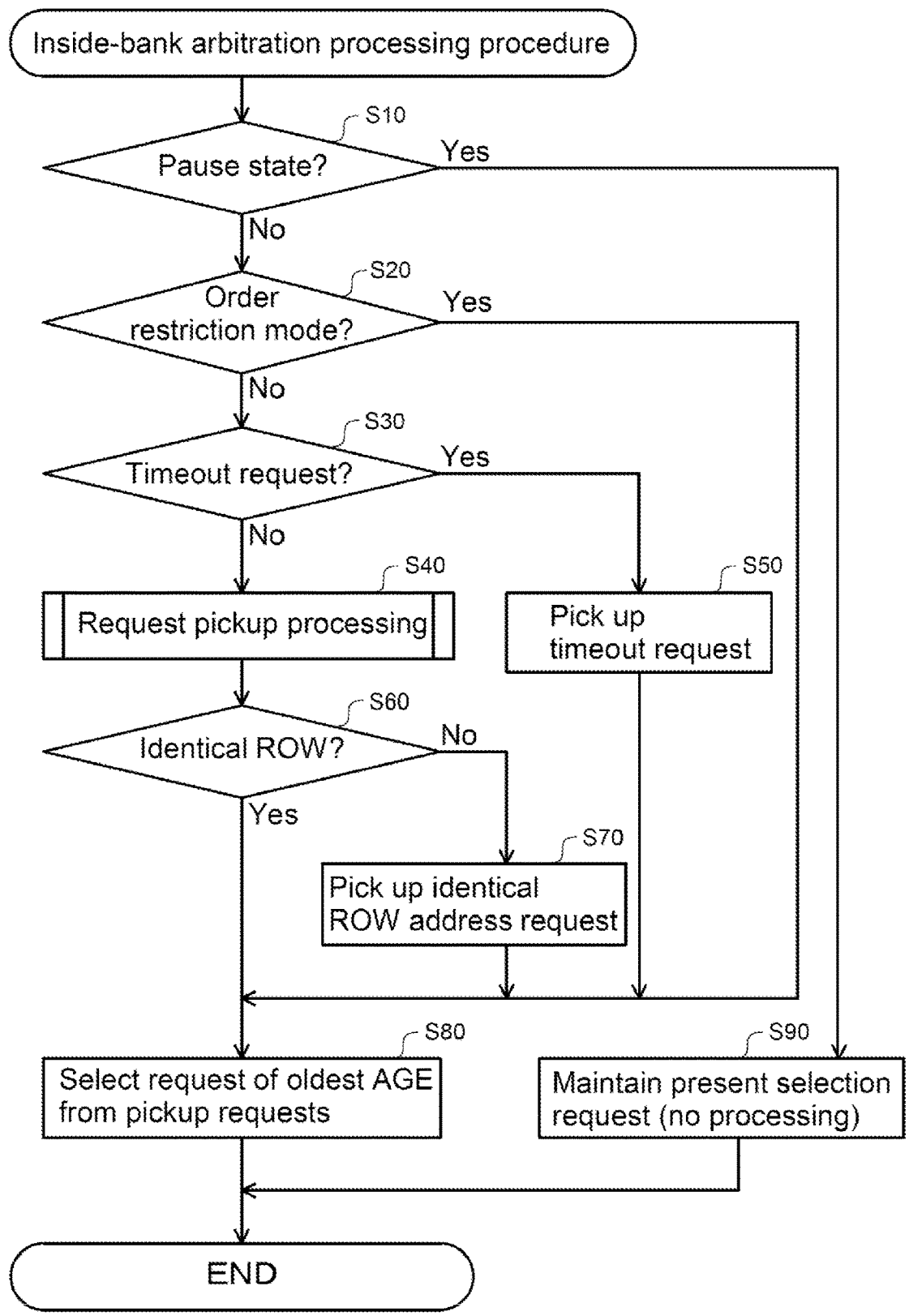
FIG. 7 is a flowchart illustrating a content of an inside-bank arbitration processing procedure according to the first embodiment.

FIG. 7 is a flowchart illustrating a content of an inside-bank arbitration processing procedure according to the first embodiment. In the inside-bank arbitration processing procedure, the inside-bank arbitration unit 6232 executes the arbitration of the write request and the read request inside the bank (the identical bank).

At Step S10, the inside-bank arbitration unit 6232 determines whether it is in a pause state (pause-on) or not. The pause state is a state between the reception of an Activate command from the inside-bank arbitration unit 6232 by the inter-bank control unit 6234 and the completion of a processing of a command (Read/Write command) of the write request or the read request subordinated to the Activate command (see FIG. 7). The processing of the Read/Write command subordinated to the Activate command means a processing executed by all the Read/Write commands with respect to the Row of the bank activated by the Activate command. The inter-bank control unit 6234 decrements the BL information every time the Read/Write command is executed, and manages the number of the Read/Write commands required for completing the transaction T.

The inside-bank arbitration unit 6232 advances the process to Step S90 when it is in the pause state, and advances the process to Step S20 when it is not in the pause state. At Step S90, the inside-bank arbitration unit 6232 maintains the present selected request, that is, maintains a transaction T2 (see FIG. 5), which is a next processing target candidate, without change.

This makes the inside-bank arbitration unit 6232 activate other Rows before all the processings with respect to the activated specific Row are completed, thus ensuring elimination of the extra PreCharge processing and Activate processing in association with reactivation of the specific Row. Consequently, the inside-bank arbitration unit 6232 ensures the efficient processing of the Read/Write command.

At Step S20, the inside-bank arbitration unit 6232 determines whether it is in the order restriction mode or not. The inside-bank arbitration unit 6232 advances the process to Step S80 when it is in the order restriction mode, and advances the process to Step S30 when it is not in the order restriction mode. The inside-bank arbitration unit 6232 advances the process to Step S80 without the arbitration, that is, with picking up all the transactions T. The order restriction mode is set according to an arbitration queue fixing processing. In the arbitration queue fixing processing, the inside-bank arbitration unit 6232 stops the arbitration of the queue of the identified bank to change the queue to the FIFO operation mode (see FIG. 14 to FIG. 16).

At Step S80, the inside-bank arbitration unit 6232 operates in an operation mode of FIFO, and selects the transaction T first saved in the first bank managing unit BM1 based on the Age information. This enables the inside-bank arbitration unit 6232 to select each transaction T without breaking a dependency of the dependency transaction.

At Step S30, for example, the inside-bank arbitration unit 6232 for the first bank managing unit BM1 determines whether there is a timeout request in the first bank managing unit BM1 or not. The timeout request is a transaction T having a DCV value that has become less than a predetermined threshold by remaining for a long time in the first bank managing unit BM1. The detail of the DCV value will be described later.

The inside-bank arbitration unit 6232 advances the process to Step S50 when there is at least one timeout request, and advances the process to Step S40 when there is no timeout request. At Step S50, the inside-bank arbitration unit 6232 advances the process to Step S80 with picking up only the timeout request.

At Step S80, the inside-bank arbitration unit 6232 selects the first saved timeout request (transaction T) among at least one timeout request saved in the first bank managing unit BM1 based on the Age information. Specifically, for example, the inside-bank arbitration unit 6232 can change the selection of the transaction T2 (see FIG. 5), which is the next processing target candidate, to the selection of a transaction T3 (see FIG. 6). This enables the inside-bank arbitration unit 6232 to preferentially process the transaction T remained over an excessively long period of time in the first bank managing unit BM1.

Although the detail will be described later, when the DCV value less than the threshold is detected for a transfer ID registered in a plurality of slots forming a chain, the internal arbitration unit 623 makes all the registered transactions T having transfer IDs on an upstream side, which should be processed before the detected transfer ID, targets of an exception processing (a timeout request processing). This enables the internal arbitration unit 623 to ensure smooth processing of the transaction T having the DCV value less than the threshold while satisfying a demand of the order restriction of the read data.

Figure 8:
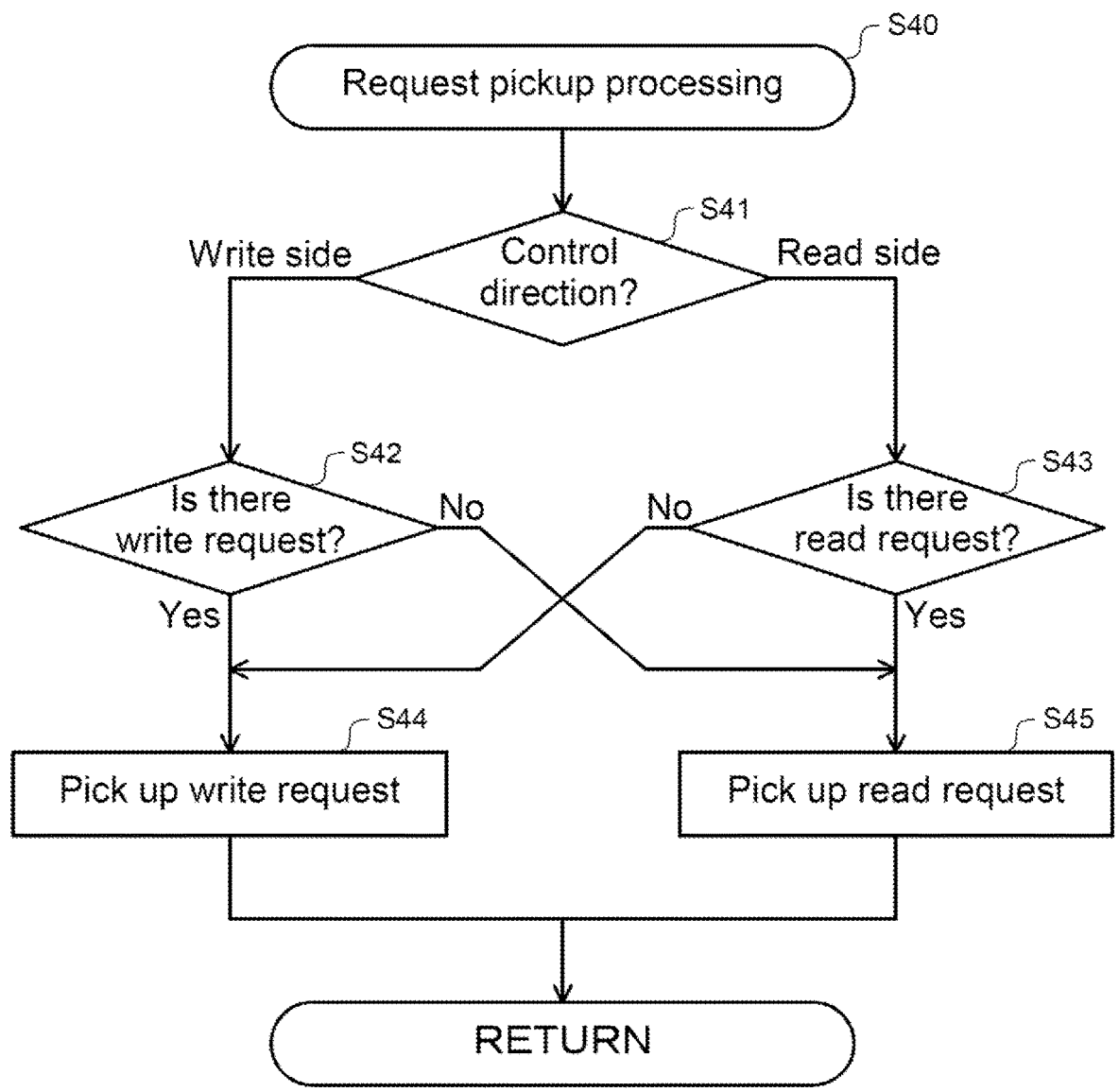
FIG. 8 is a flowchart illustrating a content of a request pickup processing according to the first embodiment.

FIG. 8 is a flowchart illustrating a content of a request pickup processing (Step S40) according to the first embodiment. The request pickup processing is a processing to pick up the write request or the read request to ensure the efficient processing, corresponding to the control direction status. The DDR memory 70 shares the internal data bus (a physical electrical signal line that connects a chip such as ASIC to a DDR memory device, not illustrated) in reading and writing. Thus, the DDR memory 70 cannot simultaneously execute the write processing and the read processing, and has a constraint penalty of a turnaround time to switch a direction of the data bus.

Accordingly, the inside-bank arbitration unit 6232 ensures the efficient processing by picking up the write request or the read request corresponding to the control direction status as described above to reduce the switch for reading and writing. However, such control sometimes cause occurrence of accumulation of the transactions T. A timer (not illustrated) may be equipped to actively execute the switch of the control direction corresponding to an elapse of a certain period of time.

At Step S41, the inside-bank arbitration unit 6232 determines whether the control direction status is a write side status or a read side status. The write side status includes a write side status that enables the write processing, and a write transition status that is a status during the transition from a read side status that enables the read processing to the write side status. The read side status includes the read side status that enables the read processing, and a read transition status that is a status during the transition from the write side status to the read side status. In this embodiment, the IDLE state S1 is included in the write side status. Accordingly, an initial state after reset release is the write side status.

The inside-bank arbitration unit 6232 advances the process to Step S42 when the control direction status is determined to be the write side status, and advances the process to Step S43 when the control direction status is determined to be the read side status.

At Step S42, the inside-bank arbitration unit 6232 picks up the write request (Step S44) when there is the write request, and picks up the read request when there is no write request. This enables the inside-bank arbitration unit 6232 to preferentially pick up the write request when the control direction status is determined to be the write side status.

At Step S43, the inside-bank arbitration unit 6232 picks up the read request (Step S45) when there is the read request, and picks up the write request when there is no read request. This enables the inside-bank arbitration unit 6232 to preferentially pick up the read request when the control direction status is determined to be the read side status.

Thus, the request pickup processing (Step S40) ensures the pickup of the write request or the read request to ensure the efficient processing, corresponding to the control direction status.

At Step S60 (see FIG. 7), the inside-bank arbitration unit 6232 determines whether there is the transaction T requesting the access to the Row identical to that of a transaction T1 that is currently processing or not. The inside-bank arbitration unit 6232, when there is such a transaction T, picks up it (Step S70), and, when there is not such a transaction T, advances the process to Step S80.

The access to the already activated Row does not require PreCharge and Activate. Accordingly, the inside-bank arbitration unit 6232 ensures the efficient processing by picking up the transaction T requesting the access to the already activated Row.

At Step S80, the inside-bank arbitration unit 6232 can select the timeout request (the transaction T) first saved in the first bank managing unit BM1 based on the Age information from among the picked-up transactions T. This enables the inside-bank arbitration unit 6232 to ensure an efficient control of the DDR memory 70 and ensure an efficient and reliable memory control by reducing the excessive accumulation of the transactions T.

The four inside-bank arbitration units 6232 transmit the arbitration results inside the respective banks to the inter-bank control unit 6234. The inter-bank control unit 6234 executes the arbitration of the write requests and the read requests between the banks (different banks): the first bank B1, the second bank B2, the third bank B3, and the fourth bank B4. In the implementation, the arbitration at a command level such as Activate_for_Read, Activate_for_Write, Read, Write, and PreCharge will be executed.

The inter-bank control unit 6234 executes the arbitration between the banks considering a time constraint between the state transitions between the banks: the first bank B1, the second bank B2, the third bank B3, and the fourth bank B4. However, a point to select the timeout request processing with the highest priority is common to the inter-bank control unit 6234 and the inside-bank arbitration unit 6232. This enables the inter-bank control unit 6234 to preferentially process the transactions T accumulated over an excessively long period of time in the first bank managing unit BM1 to the fourth bank managing unit BM4.

The internal arbitration unit 623 transmits the control data of the transaction T that is the next processing target candidate to the command generating unit 630 (see FIG. 3). The write processing is executed with command control data generated by the command generating unit 630 and data output by the write control unit 640. The read processing is executed with the command control data generated by the command generating unit 630 and data input by the read control unit 650.

The command generating unit 630 (see FIG. 3) transmits the command control data to the bank control circuit 660 based on the W/R information. The command control data is, for example, control data to execute Activate and Write. Furthermore, the command generating unit 630 transmits the transfer ID to the write control unit 640 to cause the write control unit 640 to supply the write data to the data bus at a predetermined timing when the W/R information represents writing. The command generating unit 630 transmits the transfer ID to the read control unit 650 to cause the read control unit 650 to obtain the read data from the data bus at a predetermined timing when the W/R information represents reading. In this example, the command generating unit 630 executes a processing to write the image data into the DDR memory 70. The command control data further includes the Row information, the Col information, the BL information, and the ID information.

The write control unit 640 obtains the in-buffer address that identifies the storage area of the write data inside the write buffer 681 from the write buffer table 682 by using the ID information and the BL information. The write buffer table 682 stores the in-buffer address associated with the respective bursts of the transaction T identified with the ID information. The write control unit 640 obtains the write data from the write buffer 681 by using the in-buffer address.

By using the Row information, the Col information, and the BL information, the write control unit 640 stores the write data in the first bank B1 (see FIG. 1) of the DDR memory 70, which is a management target of the first bank managing unit BM1. The write data is stored by use of the bank control circuit 660 that functions as an analog circuit.

Next, the following describes a processing where the image forming unit 30 reads the pixel data from the DDR memory 70 as a second example. The image forming unit 30 transmits the read request packet to the memory control unit 60 using the third AXI master 30M. The read request packet includes the AXI_ID used by the third AXI master 30M and the control data (including the address and the QOS value) and is also referred to as the read request data set.

In the read processing of the image data, the memory control unit 60 communicates with the NIC unit 60M by using the read address channel (R/Address) and the read data channel (R/Data). Specifically, the memory control unit 60 receives the control data in a form like a packet (also referred to as the control packet) by using the read address channel (R/Address) and transmits the image data to the NIC unit 60M in a form like a packet (also referred to as the data packet) by using the read data channel (R/Data). The control data includes the address, the QOS value, and the AXI_ID.

When the branching unit 820 determines that the processing is a processing that covers a plurality of banks (described below) and a plurality of Rows after analyzing the addresses included in the control packet, the branching unit 820 divides it into the transactions T by the banks and the Rows. In this example, each transaction T stores the AXI_ID and the read address. The read address is data where the write flag is not on in the address data (WorR/Address). Furthermore, the branching unit 820 associates the DCV value with the AXI_ID of each transaction T to transmit it to the memory control circuit 600. The buffer control unit 610 transmits the control data (including the address and the DCV value) in each transaction T to the data control unit 620.

The data control unit 620 transmits the control data of the transfer ID to the command generating unit 630 (see FIG. 3). The command generating unit 630 transmits the command control data to the read control unit 650 based on the W/R information.

The command generating unit 630 generates the command control data, and reads the data from the DDR memory 70 to put it on the data bus by using the Row information, the Col information, and the BL information. The read control unit 650 obtains the read data from the data bus. By using the ID information, the read control unit 650 obtains the in-buffer address that identifies the storage area of the read data inside the read buffer 691 from the read buffer table 692. The in-buffer address is identified with a NUM (the number of accesses) representing how many times it has been accessed with its transfer ID. The NUM is managed by the read buffer table 692 and incremented by accesses. By using the in-buffer address, the read control unit 650 stores the obtained read data in the read buffer 691.

By using the ID information, the read buffer control unit 612 of the buffer control unit 610 obtains the in-buffer address, which identifies the storage area of the read data inside the read buffer 691, from the read buffer table 692. By using the in-buffer address, the read buffer control unit 612 transfers the read data to the order control unit 670 from the read buffer 691.

By using the ID information, the order control unit 670 sorts the read data in a preliminarily set order to transmit the read data to the communication control unit 800. The communication control unit 800 can transmit the read data (in this example, the pixel data) to the image forming unit 30 without the communication arbitration unit 700. For the write request of the data and the read request of the data into/from the DDR memory 70, the communication arbitration unit 700 executes the communication arbitration as described above.

Thus, the memory control circuit 600 ensures the efficient processing by executing the request pickup processing and similar processing to pick up the write request or the read request to ensure the efficient processing corresponding to the control direction status. Furthermore, the memory control circuit 600 can execute a priority control processing that uses the DCV value as the exception processing.

The inventor has focused on a point that, when the DDR memory 70 is, for example, a Synchronous Dynamic Random Access Memory (SDRAM) device, the memory control circuit 600 is designed in consideration of existence of many constraints in its control. Specifically, in the memory control circuit 600, in the control of the SDRAM, the time constraint between the state transitions such as a period (tRRD) from an issue of an ACTIVATE command to an issue of the next ACTIVATE command and a period (tRCD) from an issue of an ACTIVATE command to an issue of a READ command occurs.

The inventor found out that the memory control circuit 600 designed in consideration of such aspect ensures a processing efficiency as a whole, and meanwhile, the data control unit 620 cannot simultaneously execute the read processing and the write processing, which may cause the memory control circuit 600 to internally accumulate unprocessed specific data, which is not picked up, in some situations. Specifically, as a simple example, for example, when one read request packet is first received, one write request packet is next received, and then, 1000 read request packets are continuously received, it is not possible to simultaneously execute the write processing and the read processing. This may accumulate the write request packet from the aspect of the efficiency of the whole processing.

To solve such a problem, the inventor has newly introduced the DCV value as a control parameter. The DCV countdown unit 622 counts down all the DCV values inside the memory control circuit 600. That is, all the DCV values inside the memory control circuit 600 are synchronously decremented (subtracted) by "1" every time a predetermined time elapses. The DCV value is changed (for example, decremented) from the DCV values of 150, 200, 250, and 300 as initial values converted based on the QOS values of 0 to 3 every time the predetermined time elapses.

When the DCV value (in this example, the DCV value less than the threshold) that has passed a predetermined value (for example, 20) as the preliminarily set threshold is detected, the internal arbitration unit 623 executes the processing with the highest priority as the exception processing (the timeout request processing) regardless of the Age information, that is, controls the DDR memory 70 by using the write control data or the read control data that includes this DCV value. That is, when the DCV value smaller than the predetermined value is detected, the internal arbitration unit 623 can execute the processing, for example, by switching the direction of the data bus as necessary and performing the transition (the activation) to an available state even if the bank of the write destination or the read destination is not in the available state.

Thus, the image forming apparatus 1 according to the first embodiment inherits the QOS value that is used to ensure the efficient and reliable internal communication in the communication between the memory control unit 60 and the other units such as the image processing unit 20, and ensures the efficient and reliable communication even if unpredictable accumulation inside the memory control unit 60 occurs.

Specifically, the memory control unit 60 is configured to execute the priority control processing by using the DCV value, and thus ensures not only, for example, in the image reading processing, elimination of the data disposal (the data missing) caused by the excessive transmission delay of the sequentially generated image data, but also, in the image formation processing, elimination of the dot omission (the image missing) caused by the excessive transmission delay of the pixel data, which is sequentially required for the exposing unit 31.

D. Data Read Processing Procedure

Figure 9:
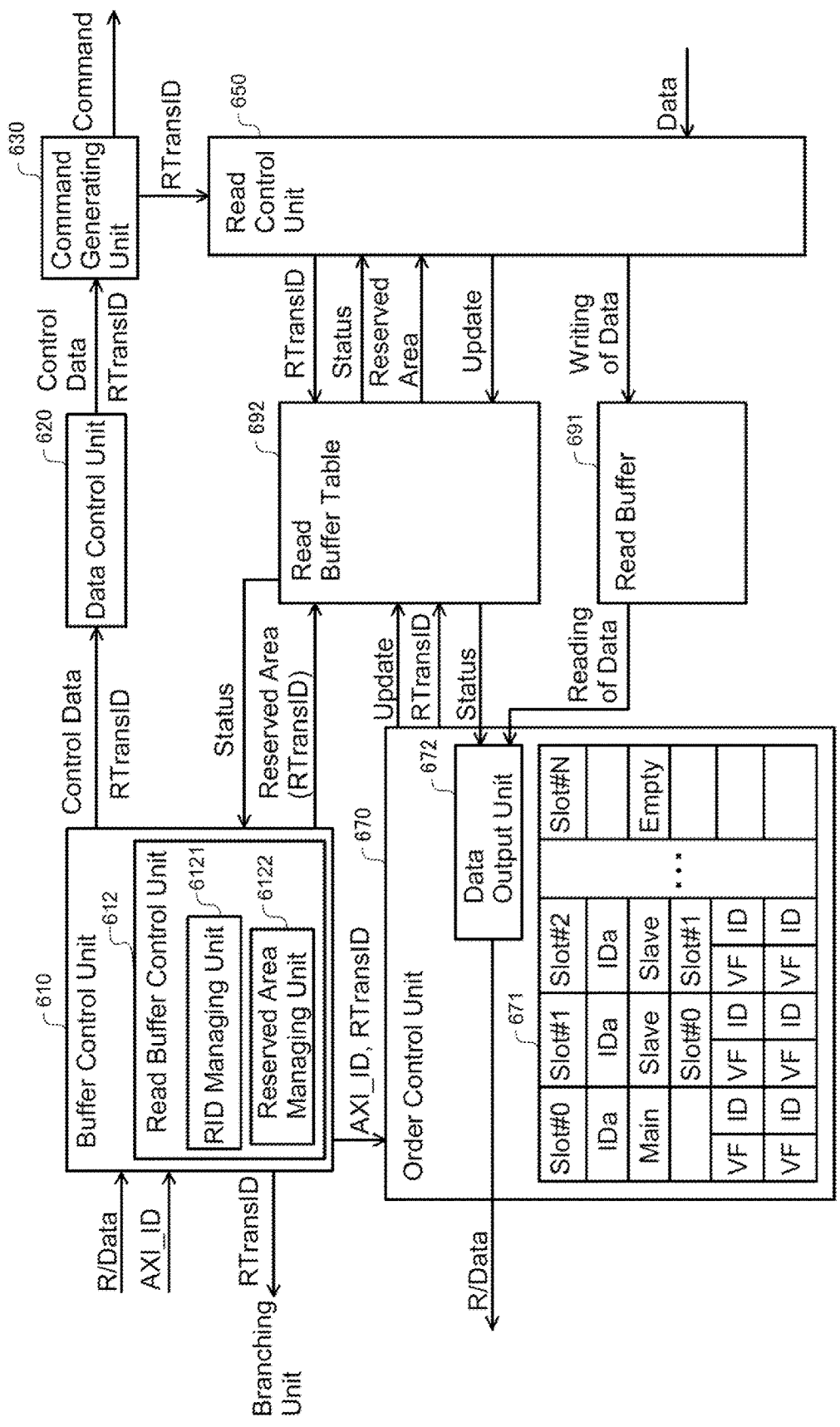
FIG. 9 is a block diagram illustrating a functional configuration regarding a data read processing in the memory control circuit 600 according to the first embodiment.

FIG. 9 is block diagram illustrating a functional configuration regarding a data read processing in the memory control circuit 600 according to the first embodiment. The read buffer control unit 612 of the buffer control unit 610 includes an RID managing unit 6121 and a reserved area managing unit 6122. The RID managing unit 6121 manages the transfer ID (RTransID) used in the data read processing. The reserved area managing unit 6122 assigns and reserves the storage area of the read data inside the read buffer 691 in association with the transfer ID.

The order control unit 670 includes an order managing unit 671, which functions as an ordering queue to arrange the order of the read data, and a data output unit 672. The order control unit 670 has a function, when the AXI master (for example, the first AXI master 10M) requests a plurality of data reading processings from the memory control unit 60, to transmit the read data in accordance with the order requested by the AXI master using an identical AXI_ID. That is, the order control unit 670, when receiving a plurality of data read requests having the identical AXI_ID, can transmit the read data in the order of this reception of the data read requests. This enables the memory control circuit 600 to fulfill the AXI specification. In this example, that is, in this embodiment, to make the description understandable, it is assumed that each AXI master uses one AXI_ID.

Figure 10:
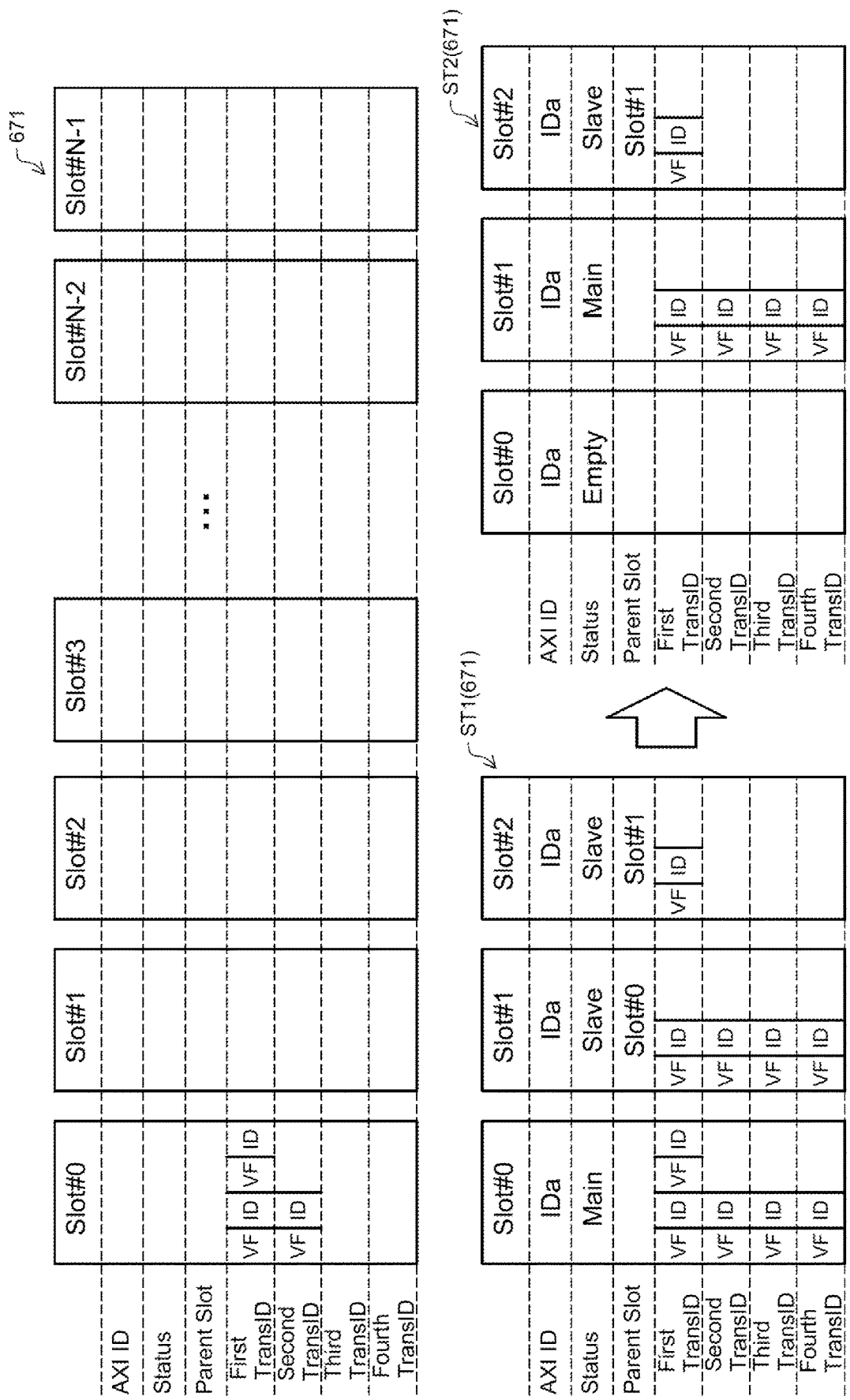
FIG. 10 is a block diagram illustrating a content of an order managing unit 671 according to the first embodiment.

FIG. 10 is a block diagram illustrating a content of the order managing unit 671 according to the first embodiment. The order managing unit 671 includes N pieces of slots: #0 (expressed in Slot #0) to #N−1 (expressed in Slot #N−1). Each slot has an AXI_ID storage area, a status storage area, a parent slot storage area, a first transfer ID storage area (top), a second transfer ID storage area, a third transfer ID storage area, and a fourth transfer ID storage area (bottom). The first to fourth transfer ID storage areas store valid flags VF indicating that the transfer ID is validly stored, and the transfer IDs.

The AXI_ID storage area is an area that stores the AXI_ID of the AXI master (for example, the first AXI master 10M) that is a transmission source of the read request data set. In this example, the first to fourth transfer ID storage areas each are configured to store at least one (in this example, up to two) transfer ID generated from the read request data set, and ordered from top (a storage position to be processed in first) to bottom (a storage position to be processed later).

The status storage area is an area to store any Status of Main, Slave, and Empty. Main indicates that the slot is a slot storing the oldest transfer ID among the transfer IDs associated with each AXI_ID. Slave indicates that the slot is subordinated to another slot, that is, the slot is processed after the other slot that is superior. The parent slot storage area indicates, in the slot whose Status is Slave, parent-slot identifying information as information for identifying the parent slot as its superior destination.

Specifically, for example, the order managing unit 671 has #0 slot that is Main, #1 slot subordinated to #0 slot, and #2 slot subordinated to #1 slot in a state ST1. In this example, the order control unit 670 will process the respective transfer IDs in order of #0 slot, #1 slot, and #2 slot.

Figure 11:
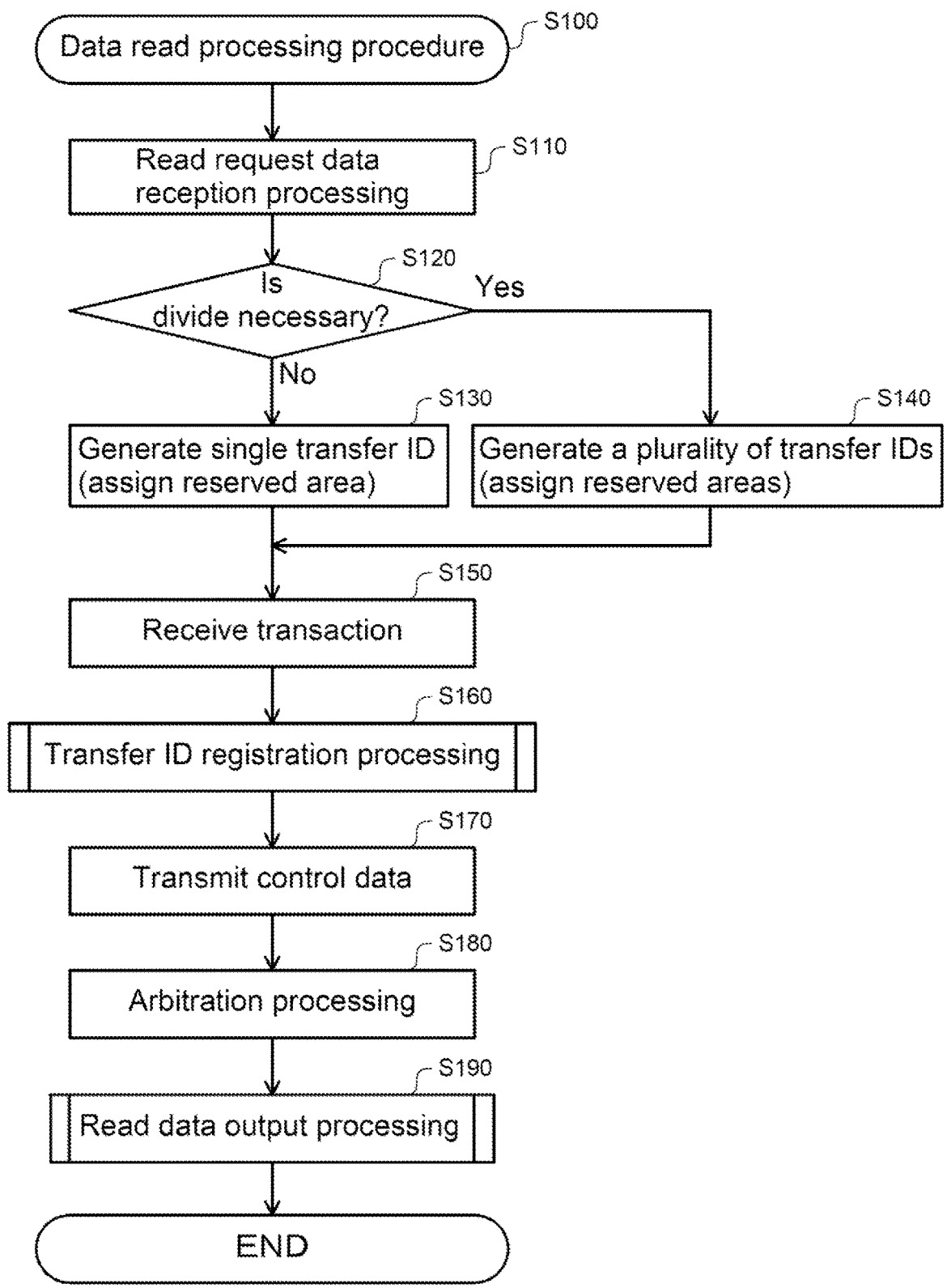
FIG. 11 is a flowchart illustrating a content of a data read processing procedure according to the first embodiment.

FIG. 11 is a flowchart illustrating a content of a data read processing procedure according to the first embodiment. At Step S110, the memory control unit 60 receives the read request data set from, for example, the third AXI master 30M connected to the image forming unit 30. The read request data set includes the AXI_ID representing the third AXI master 30M, and the control data (including the address and the QOS value).

At Step S120, the branching unit 820 analyzes the control data (the address and the AXI_BL information) of the read request data set to obtain the Row information, the Col information, and the BL information, thus determining a necessity of a divide. The branching unit 820 (see FIG. 2) advances the process to Step S130 when the divide is unnecessary, and advances the process to Step S140 when the divide is necessary.

At Step S130, the branching unit 820 requests a single transfer ID from the buffer control unit 610 (see FIG. 9) by passing the AXI_BL information. The RID managing unit 6121 of the buffer control unit 610 selects one from empty (unused) transfer IDs. The reserved area managing unit 6122 reserves a part of an empty area inside the read buffer 691 in association with the selected transfer ID to assign the reserved area. The reserved area has a size determined based on the BL information that is the information representing the number (for example, four or eight) of bursts. The reserved area managing unit 6122 stores the address and the status of the reserved area in the read buffer table 692. The status includes four states: Activate, Assigned, Written, and Transferred (Empty) of the read buffer 691. The reserved area managing unit 6122 stores Assigned as the status of the reserved area.

At Step S140, the branching unit 820 divides the read request data set into a plurality of (in this example, up to two) transactions T to generate the Row information, the Col information, and the BL information of the respective transactions T. The branching unit 820 requests the transfer ID from each of the plurality of transactions T. The RID managing unit 6121 of the buffer control unit 610 selects a plurality of transfer IDs. The reserved area managing unit 6122 reserves a part of the empty area inside the read buffer 691 in association with the respective selected plurality of transfer IDs to assign a plurality of reserved areas. The reserved area managing unit 6122 stores the addresses of the plurality of reserved areas in the read buffer table 692. The reserved area managing unit 6122 stores Assigned as the statuses of the plurality of reserved areas.

At Step S150, the buffer control unit 610 receives the transactions T from the branching unit 820. Each transaction T includes the AXI_ID and the transfer ID. The RID managing unit 6121 of the buffer control unit 610 passes the AXI_ID and the transfer ID (RtransID) to the order control unit 670 corresponding to the reception of the transaction T to request registration of the transfer ID. The order control unit 670 searches the AXI_ID in the AXI_ID storage area of the order managing unit 671.

Figure 12:
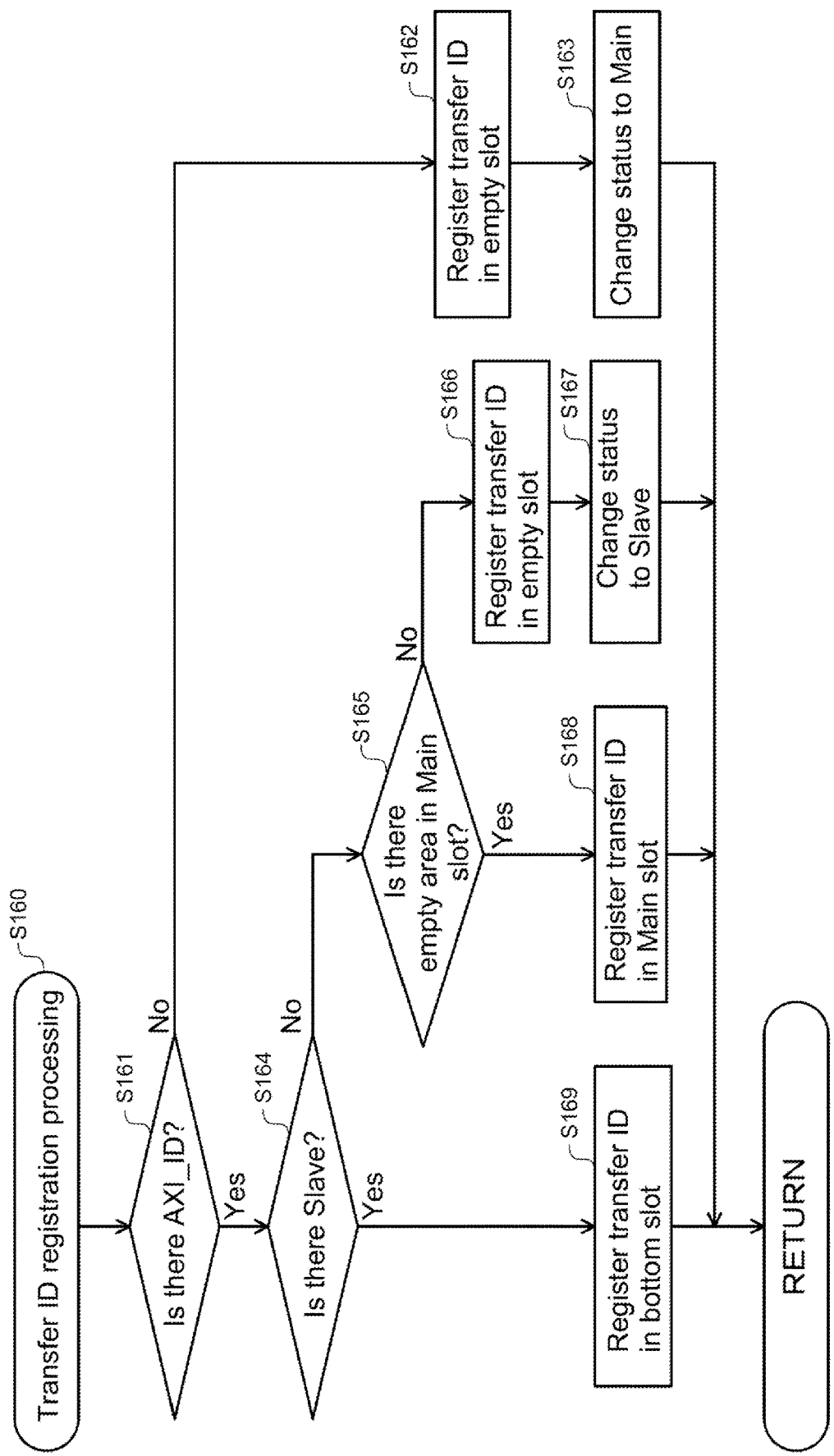
FIG. 12 is a flowchart illustrating a content of a transfer ID registration processing according to the first embodiment.

FIG. 12 is a flowchart illustrating a content of a transfer ID registration processing (Step S160) according to the first embodiment. At Step S161, the order control unit 670 determines whether there is a slot where an AXI_ID identical to the AXI_ID associated with the transaction T is stored in the AXI_ID storage area or not. The order control unit 670 advances the process to Step S162 when there is not such a slot, and advances the process to Step S164 when there is such a slot.

At Step S162, the RID managing unit 6121 selects one of the empty slots, that is, the slots where the Empty status is stored in the status storage area, and registers the transfer ID in the first transfer ID storage area that is the top storage area of the selected slot. At Step S163, the RID managing unit 6121 changes the status to Main, that is, stores the Main status in the status storage area of the slot where the transfer ID has been registered.

When the empty slot does not remain, the read buffer control unit 612 cannot supply the transfer ID (RtransID) for the read processing to the branching unit 820. Accordingly, the branching unit 820 will stop the generation of the read transaction T and generate only the write transaction T.

At Step S164, the order control unit 670 determines whether there is a Slave slot where the AXI_ID identical to the AXI_ID associated with the transaction T is stored in the AXI_ID storage area or not. The order control unit 670 advances the process to Step S165 when there is not such a slot, and advances the process to Step S169 when there is such a slot.

At Step S165, the order control unit 670 determines whether there are empty areas in the first to fourth transfer ID storage areas of the Main slot to which the Slave slot is not subordinated or not. The order control unit 670 advances the process to Step S166 when there is no empty area, and advances the process to Step S168 when there are the empty areas. At Step S168, the order control unit 670 registers the transfer ID in the top storage area among the empty areas in the first to fourth transfer ID storage areas.

At Step S166, the order control unit 670 selects one of the empty slots, and registers the transfer ID in the first transfer ID storage area that is the top storage area of the selected slot. At Step S167, the order control unit 670 changes the status to Slave, and stores a slot number of the Main slot that is the superior destination in the parent slot storage area.

At Step S169, the order control unit 670 registers the transfer ID in the bottom slot among the Slave slots. Specifically, for example, as illustrated in the state ST1 in FIG. 10, the order control unit 670 registers the transfer ID in the #2 Slave slot that is the bottom slot. The #2 Slave slot is a lower slot of the #1 Slave slot. The #1 Slave slot is a lower slot of the Main #0 slot. Thus, the order control unit 670 causes the plurality of slots (transfer IDs) from the Main #0 slot to the #2 Slave slot that is the bottom slot to form a chain.

When there is no empty area in the bottom slot, the order control unit 670 selects one of the empty slots, registers the transfer ID in the first transfer ID storage area that is the top storage area of the selected slot, changes the status to Slave, and stores the slot number of the Main slot that is the superior destination in the parent slot storage area.

Meanwhile, when the DCV value less than the threshold is detected for the transfer ID registered in the plurality of slots that form the chain as described above, the internal arbitration unit 623 makes all the transactions T having transfer IDs on the upstream side of the detected transfer ID the targets of the exception processing (the timeout request processing). This ensures the smooth processing of the transaction T having the DCV value less than the threshold.

At Step S170, the buffer control unit 610 transmits the control data (including the address and the DCV value) in each transaction T to the data control unit 620. At Step S180, the internal arbitration unit 623 executes an arbitration processing to output the command control data. The read control unit 650 reads the data from the DDR memory 70 based on the command control data, and obtains the address of the reserved area from the read buffer table 692 using the transfer ID and the NUM (the number of accesses). The read control unit 650 writes the data read using the address of the reserved area into the read buffer 691, and changes (Updates) the status of the reserved area inside the read buffer table 692 to Written corresponding to the completion of writing.

Figure 13:
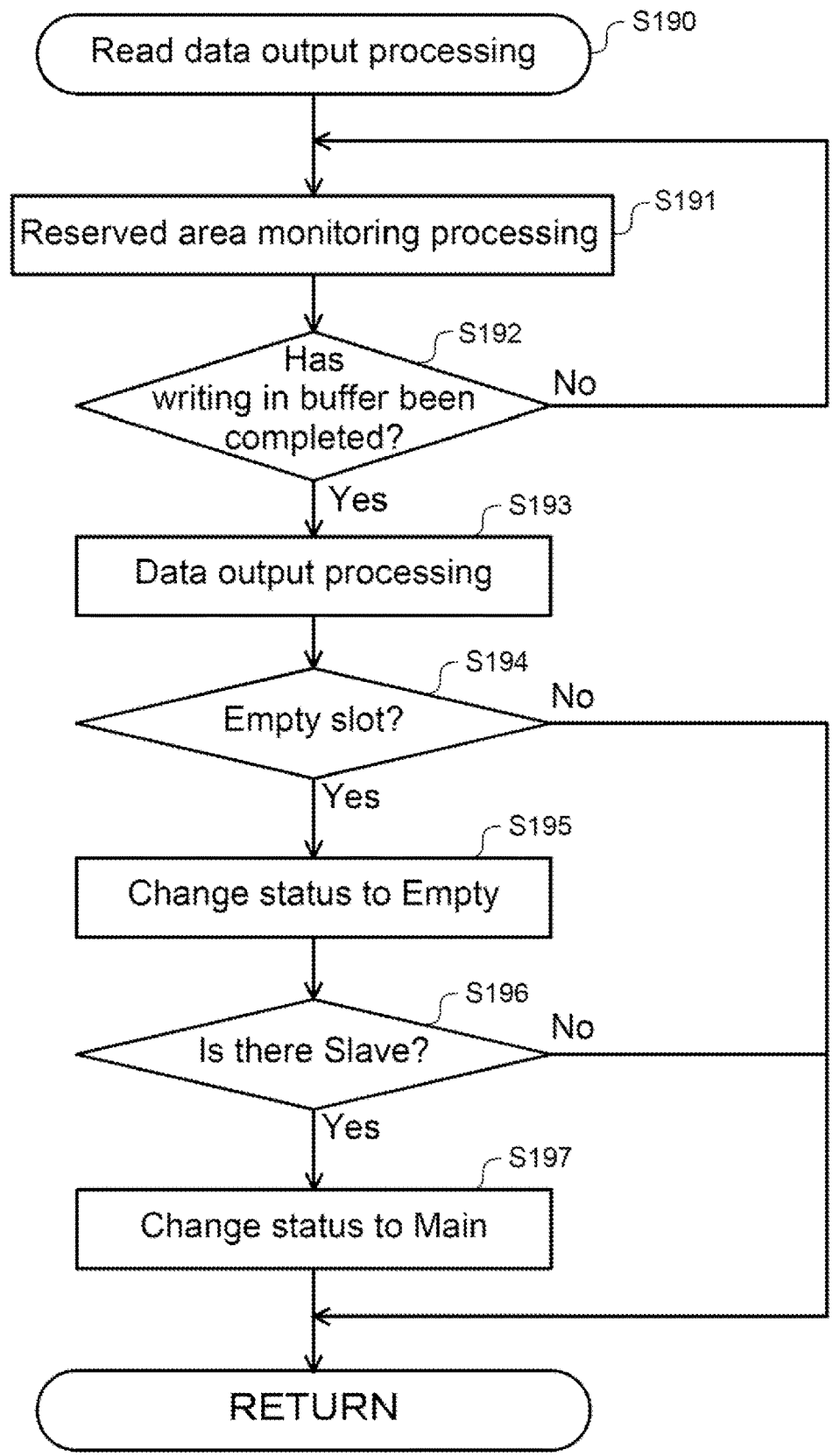
FIG. 13 is a flowchart illustrating a content of a read data output processing according to the first embodiment.

FIG. 13 is a flowchart illustrating a content of a read data output processing (Step S190) according to the first embodiment. At Step S191, the data output unit 672 monitors the status of the transfer ID stored in the top storage area of the Main slot, inside the read buffer table 692.

At Step S192, the data output unit 672 advances the process to Step S193 corresponding to the detection of the status change to Written of the reserved area associated with the transfer ID stored in the top storage area of the Main slot.

At Step S193, the data output unit 672 outputs the read data (R/Data) written into the reserved area. The data output unit 672 deletes the transfer ID from the top storage area of the Main slot, and the reserved area managing unit 6122 changes the corresponding status in the read buffer table 692 to Transferred (Empty).

At Step S194, the data output unit 672 determines whether the slot has become the empty slot by the deletion of the transfer ID or not. The data output unit 672 advances the process to Step S195 when the slot has become the empty slot, and completes the process of the read data output processing (Step S190) when the slot has not become the empty slot. At Step S195, the data output unit 672 changes the status of the slot to Empty (see the states ST1 and ST2 in FIG. 10).

At Step S196, the data output unit 672 determines whether there is the Slave slot subordinated to the slot that has become the empty slot or not. The data output unit 672 advances the process to Step S197 when there is the Slave slot, and completes the process of the read data output processing (Step S190) when there is no Slave slot.

At Step S197, the data output unit 672 changes the status of the Slave slot that is subordinated to the slot that has become the empty slot and stores the slot number of the empty slot in the parent slot storage area to Main (see the states ST1 and ST2 in FIG. 10). This enables the data output unit 672 to make the transfer ID stored in the top of the slot that has newly become Main a monitoring target.

Meanwhile, the internal arbitration unit 623 monitors a count of the empty slots, and when the count of the empty slots has become less than the preliminarily set threshold, adjusts a switch method of the control direction status. Specifically, when the count of the empty slots has become less than the threshold, the internal arbitration unit 623 facilitates the switch to the read side status, while adjusting the switch method of the control direction status to reduce the switch to the write side status.

This enables the memory control unit 60 to ensure the smooth read processing by efficiently using the read buffer 691 without necessitating an excessively many buffer areas inside the read buffer 691.

E. Data Write Processing Procedure

Figure 14:
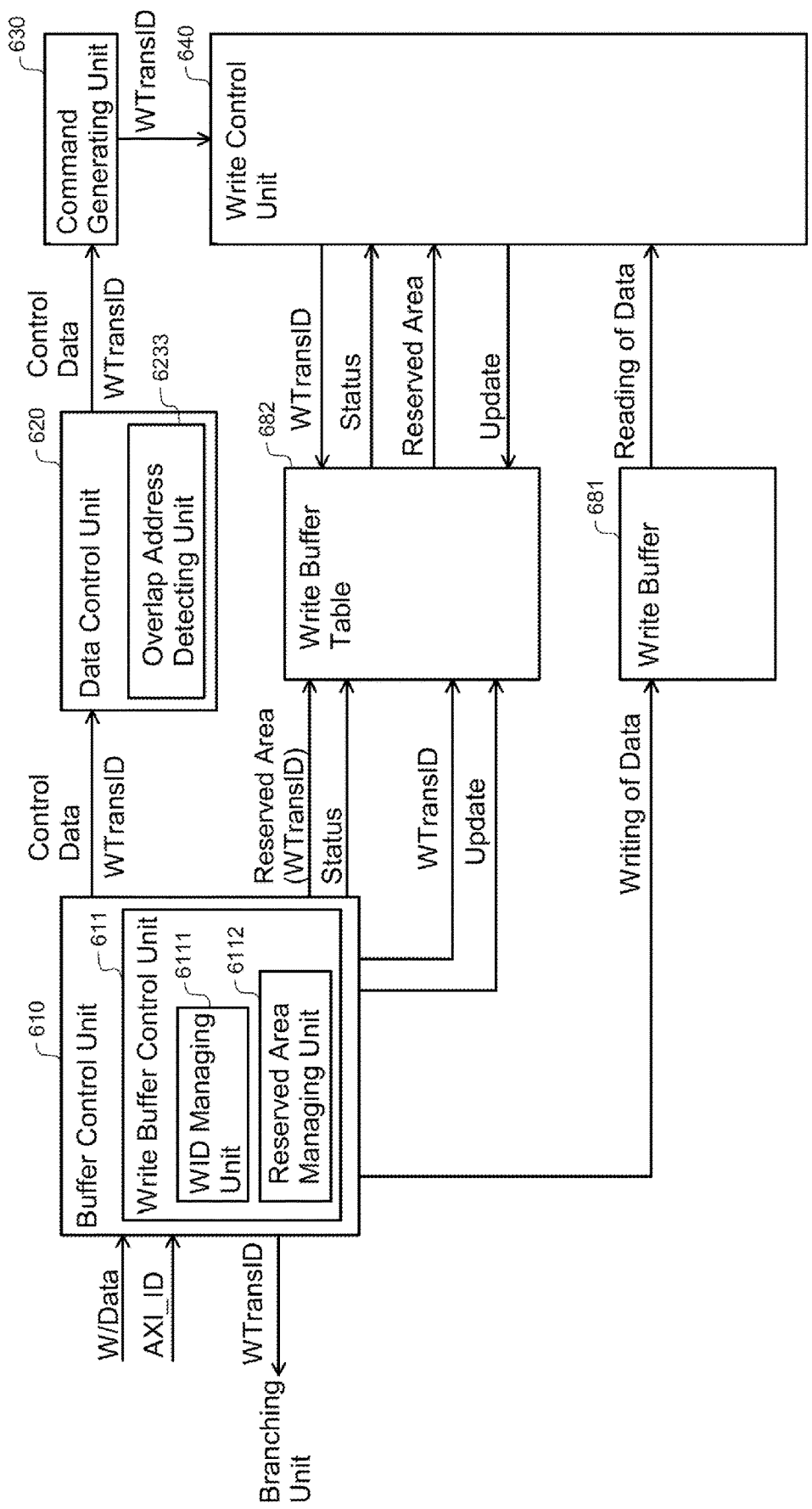
FIG. 14 is a block diagram illustrating a functional configuration regarding a data write processing in the memory control circuit 600 according to the first embodiment.

FIG. 14 is a block diagram illustrating a functional configuration regarding a data write processing in the memory control circuit 600 according to the first embodiment. The write buffer control unit 611 of the buffer control unit 610 includes a WID managing unit 6111 and a reserved area managing unit 6112. The WID managing unit 6111 manages the transfer ID used in the data read processing. The reserved area managing unit 6112 assigns and reserves the storage area of the write data inside the write buffer 681 in association with the transfer ID.

In the data write processing, although the AXI master requests a plurality of data writings from the memory control unit 60, there is no restriction in a write order like the restriction in the data reading processings. Accordingly, the data write processing does not require a configuration such as the order control unit.

Figure 15:
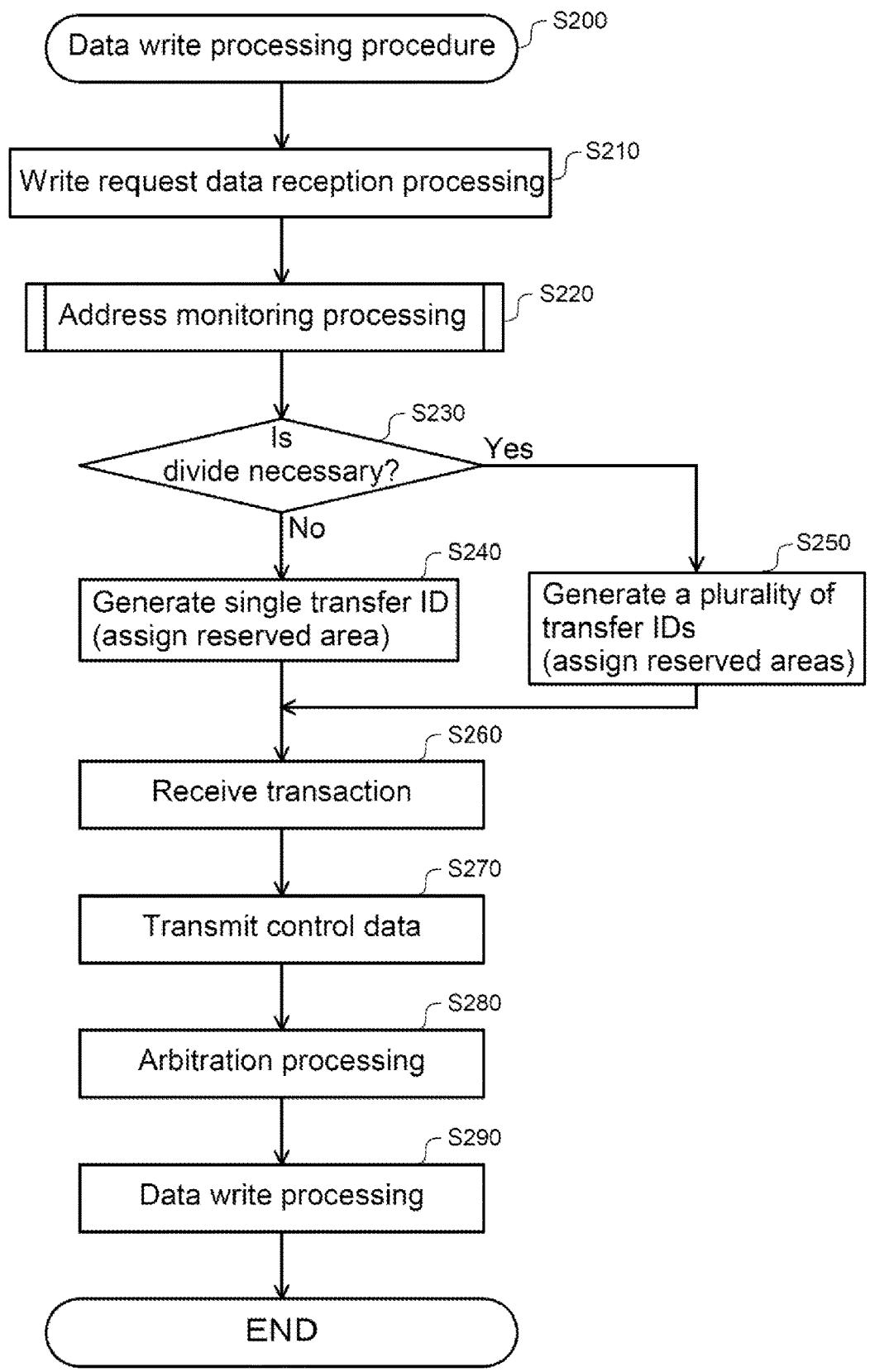
FIG. 15 is a flowchart illustrating a content of a data write processing procedure according to the first embodiment.

FIG. 15 is a flowchart illustrating a content of a data write processing procedure (Step S200) according to the first embodiment. At Step S210, the memory control unit 60 receives the write request data set from, for example, the fifth AXI master 50M connected to the image reading unit 50. The write request data set includes the AXI_ID representing the fifth AXI master 50M, and the control data (including the address and the QOS value).

At Step S220, the overlap address detecting unit 6233 of the data control unit 620 executes an address monitoring processing. The address monitoring processing is executed concurrently with the respective processings at Steps S230 to S290 and changes the operation mode of the inside-bank arbitration unit 6232 to the order restriction mode as necessary. The detail of the address monitoring processing will be described later.

At Step S230, the branching unit 820 analyzes the control data (the address and the AXI_BL information) of the write request data set to obtain the Row information, the Col information, and the BL information, thus determining the necessity of the divide. The branching unit 820 advances the process to Step S240 when the divide is unnecessary, and advances the process to Step S250 when the divide is necessary.

At Step S240, the branching unit 820 requests a single transfer ID from the buffer control unit 610 by passing the AXI_BL information. The WID managing unit 6111 of the buffer control unit 610 selects one from empty (unused) transfer IDs. The reserved area managing unit 6112 reserves a part of an empty area inside the write buffer 681 in association with the selected transfer ID to assign the reserved area. The reserved area has a size determined based on the BL information that is the information representing the number (for example, four or eight) of bursts. The reserved area managing unit 6112 stores the address and the status of the reserved area in the write buffer table 682. The status includes three states: Assigned, Written, and Transferred (Empty) of the write buffer 681. The reserved area managing unit 6112 stores Assigned as the status of the reserved area.

At Step S250, the branching unit 820 divides the write request data set into a plurality of transactions T to generate the Row information, the Col information, and the BL information of the respective transactions T. The branching unit 820 requests the transfer ID from each of the plurality of transactions T. The WID managing unit 6111 of the buffer control unit 610 selects a plurality of transfer IDs. The reserved area managing unit 6112 reserves a part of the empty area inside the write buffer 681 in association with the respective selected plurality of transfer IDs to assign a plurality of reserved areas. The reserved area managing unit 6112 stores the addresses of the plurality of reserved areas in the write buffer table 682. The reserved area managing unit 6112 stores Assigned as the statuses of the plurality of reserved areas.

At Step S260, the buffer control unit 610 receives the transactions T and the write data from the branching unit 820. Each transaction T includes the AXI_ID and the transfer ID. The buffer control unit 610 confirms that the status of the reserved area inside the write buffer 681 is Assigned to write the write data, and then, changes the status of the reserved area to Written.

At Step S270, the buffer control unit 610 transmits the control data (including the address and the DCV value) in each transaction T to the data control unit 620. At Step S280, the internal arbitration unit 623 executes the arbitration processing to output the command control data.

At Step S290, the write control unit 640 executes the data write processing. In the data write processing, the write control unit 640 reads the data from the DDR memory 70 based on the command control data, and obtains the address of the reserved area from the write buffer table 682 using the transfer ID and the NUM (the number of accesses). The write control unit 640 writes the data read from the write buffer 681 using the address of the reserved area into the DDR memory 70, and changes (Updates) the status of the reserved area inside the write buffer 681 to Transferred (Empty) corresponding to the completion of writing.

Figure 16:
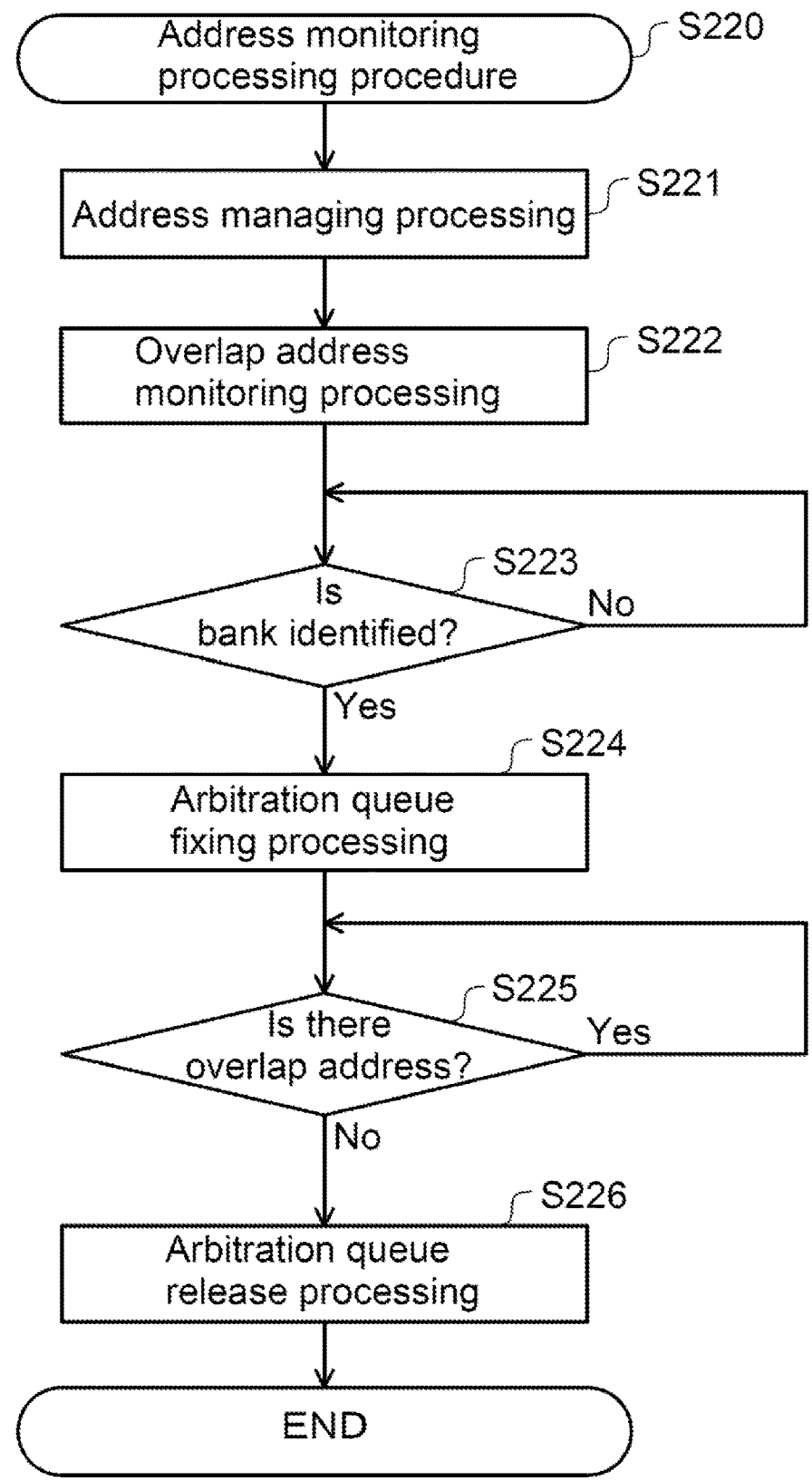
FIG. 16 is a flowchart illustrating a content of an address monitoring processing procedure according to the first embodiment.

FIG. 16 is a flowchart illustrating a content of an address monitoring processing procedure according to the first embodiment. In the address monitoring processing, the overlap address detecting unit 6233 monitors overlap access request data that is the write request data set and the read request data set that specify the address that is at least partially overlapping the address of the write destination of the write request data set, and restricts the arbitration processing related to its input. In this aspect, there are following three combinations.

(i) Combination of the write request data set (preceding input) and the read request data set (following input)
(ii) Combination of the read request data set (preceding input) and the write request data set (following input)
(iii) Combination of the write request data sets (i) In the combination of the write request data set (preceding input) and the read request data set (following input), when the read request data set (following input) is processed prior to the write request data set (preceding input) due to the arbitration, the problem, in which the obsolete data prior to the writing with the write request data set is read, occurs. Thus, an arbitration stop is demanded. This combination is also referred to as a "first combination."

(ii) In the combination of the read request data set (preceding input) and the write request data set (following input), when the write request data set (following input) is processed prior to the read request data set (preceding input) due to the arbitration, the problem, in which the data to be read is overwritten with the write request data set (following input), occurs. Thus, the arbitration stop is demanded. This combination is also referred to as a "second combination."

(iii) In the combination of the write request data sets, when the write request data set (following input) is processed prior to the write request data set (preceding input) due to the arbitration, the problem, in which the data to finally remain by the write request data set (following input) is overwritten by the write request data set (preceding input), occurs. Thus, an arbitration stop is demanded. This combination is also referred to as a "third combination."

The memory control unit 60 transmits a Write/Response signal corresponding to the reception of the write request data (see FIG. 2). The memory control unit 60 is configured to assure that the write request data set and the read request data set are processed, on the premise that the write processing by this write request data has been completed, after the transmission of the Write/Response signal. In this embodiment, this assurance is ensured by the address monitoring processing.

At Step S221, the overlap address detecting unit 6233 of the buffer control unit 610 executes an address managing processing. In the address managing processing, the overlap address detecting unit 6233, in response to an input of the write request data set, manages the bank information of the write destination, the Row information, and the Col information of the write transaction T as a monitoring target address.

At Step S222, the overlap address detecting unit 6233 executes an overlap address monitoring processing. In the overlap address monitoring processing, the overlap address detecting unit 6233, in response to the input of the write request data set or the read request data set, monitors the bank information, the Row information, and the Col information specified with the transaction T (the write transaction T and the read transaction T) by the write request data set and the read request data set, in the first bank managing unit BM1 to the fourth bank managing unit BM4.

The overlap address detecting unit 6233, in response to the input of the read request data set, searches an overlap address that is an overlap between an address as a read target in the read request data set and the monitoring target address. The overlap address detecting unit 6233, in response to the detection of the overlap address, identifies the bank where the overlap address has been detected. This enables the overlap address detecting unit 6233 to solve the problem corresponding to the first combination.

The overlap address detecting unit 6233, in response to the input of the write request data set, searches an overlap address that is an overlap between an address as a write target in the write request data set and the monitoring target address (the third combination), and further searches an overlap address that is an overlap between an address as a write target in the write request data set and an address as a read target of the read request data set, which has already been stored in the first bank managing unit BM1 to the fourth bank managing unit BM4, (the second combination). The overlap address detecting unit 6233, in response to the detection of the overlap address, identifies the bank where the overlap address has been detected. This enables the overlap address detecting unit 6233 to solve the problems corresponding to the second and third combinations.

At Step S223, the inside-bank arbitration unit 6232, in response to the identification of the bank where the overlap address has been detected, executes the arbitration queue fixing processing of the identified bank (Step S224). In the arbitration queue fixing processing, the inside-bank arbitration unit 6232 stops the arbitration of the queue of the identified bank to change the queue to the FIFO operation mode (the order restriction mode). This makes the inside-bank arbitration unit 6232 stop the arbitration to avoid the problems of the above-described first combination to third combination.

At Step S225, the overlap address detecting unit 6233 can determine whether the overlap address is eliminated or not based on the BL information of the transaction T specifying the monitoring target address related to the overlap access request data in the first bank managing unit BM1 to the fourth bank managing unit BM4. Specifically, the overlap address detecting unit 6233 monitors the BL information decremented by the inter-bank control unit 6234 every time the Read/Write command is executed, for the transaction T specifying the monitoring target address. When the Read/Write command is executed on the last burst, the transaction T becomes "Processed," and the overlap address detecting unit 6233 can determine that the overlap address is eliminated.

When the overlap address inside the respective banks is determined not to remain, the overlap address detecting unit 6233 executes an arbitration queue release processing for the respective banks (Step S226). In the arbitration queue release processing, the inside-bank arbitration unit 6232 changes the operation mode of the queue of the fixed bank from the FIFO (the order restriction mode) to resume the arbitration.

Meanwhile, the internal arbitration unit 623 monitors an amount of an unused storage area and a count of available transfer IDs of the write buffer 681, and when each has become less than the preliminarily set threshold, adjusts the switch method of the control direction status. Specifically, when the amount of the unused storage area of the write buffer 681 or similar value has become less than the threshold, the internal arbitration unit 623 facilitates the switch to the write side status, while adjusting the switch method of the control direction status to reduce the switch to the read side status.

This enables the memory control unit 60 to ensure the smooth read processing by efficiently using the write buffer 681 without necessitating excessively many buffer areas inside the write buffer 681.

F. Functional Configuration of Image Forming Apparatus According to a Second Embodiment (Corresponding Processing Procedure in tFAW Delay)

Figure 17:
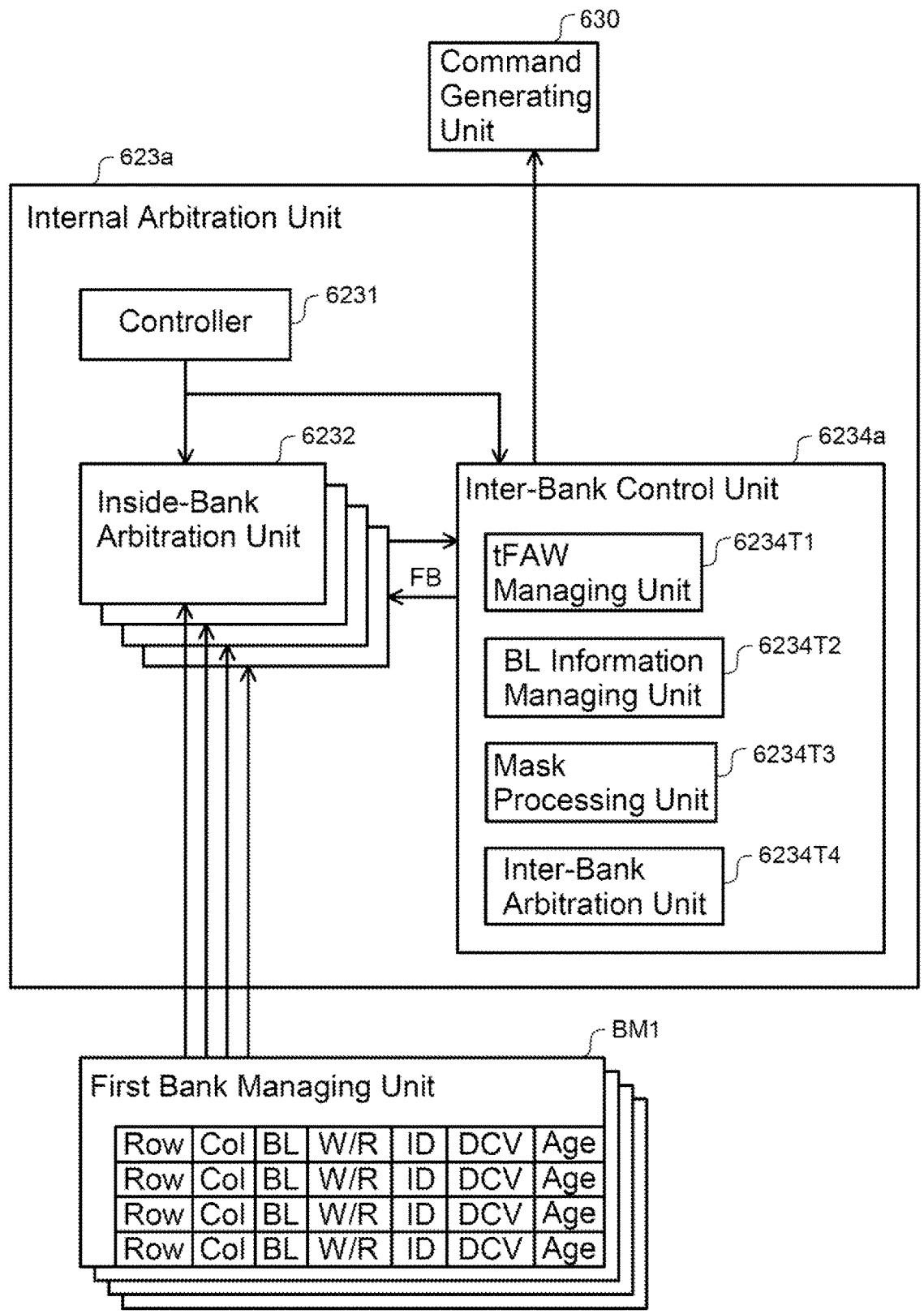
FIG. 17 is a block diagram illustrating a functional configuration of an internal arbitration unit 623a according to a second embodiment.

FIG. 17 is a block diagram illustrating a functional configuration of an internal arbitration unit 623a according to the second embodiment. The internal arbitration unit 623a according to the second embodiment is different from the internal arbitration unit 623 according to the one embodiment in that the internal arbitration unit 623a can execute the arbitration considering the tFAW delay. The internal arbitration unit 623a according to the second embodiment includes an inter-bank control unit 6234a instead of the inter-bank control unit 6234. The inter-bank control unit 6234a includes a tFAW managing unit 6234T1, a BL information managing unit 6234T2, a mask processing unit 6234T3, and an inter-bank arbitration unit 6234T4. The BL information managing unit 6234T2 is also referred to as a remaining burst number managing unit.

Figure 18:
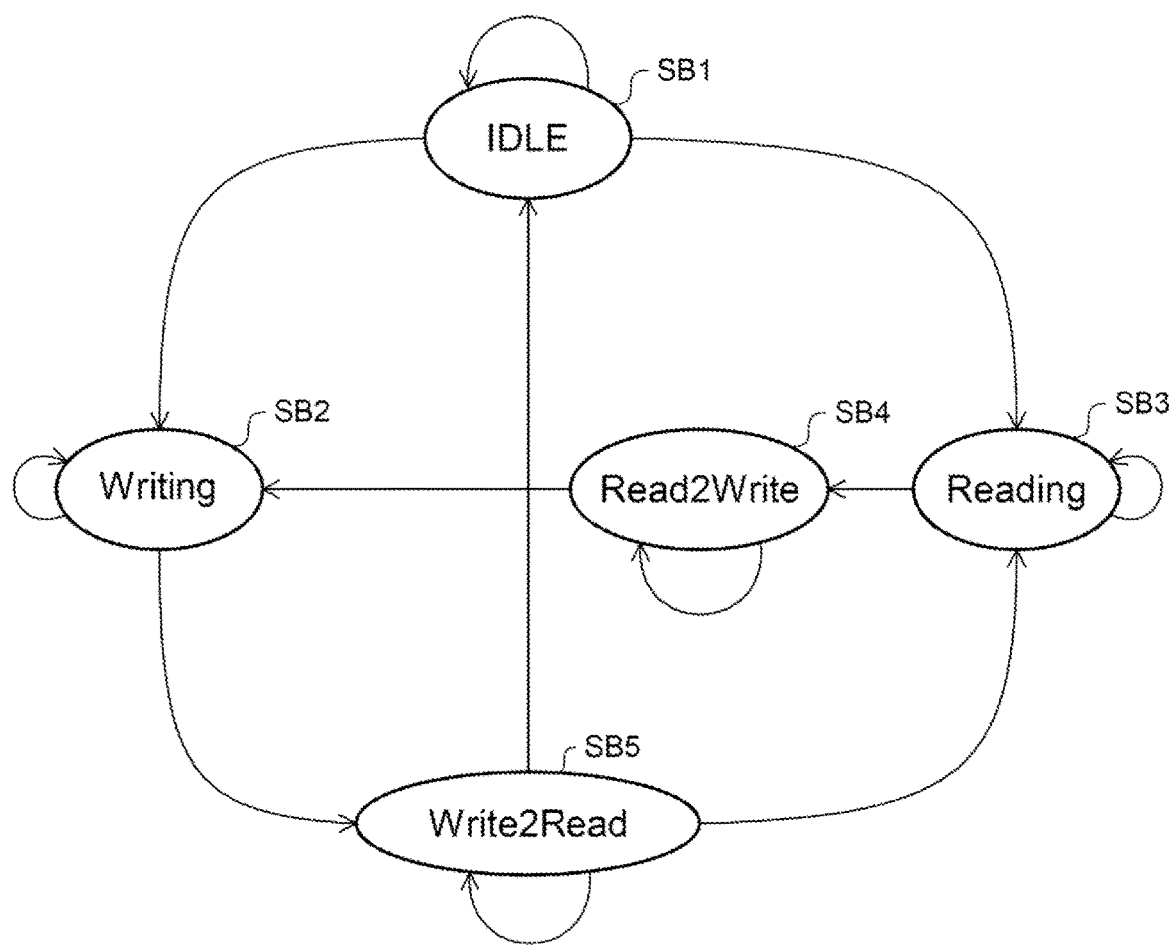
FIG. 18 is a state transition diagram illustrating a control direction status of an inter-bank control unit 6234a according to the second embodiment.

FIG. 18 is a state transition diagram illustrating a control direction status of the inter-bank control unit 6234a according to the second embodiment. The control direction status has five states including an IDLE state SB1, a Writing state SB2, a Reading state SB3, a Read2Write state SB4, and a Write2Read state SB5. The Read2Write state SB4 is also referred to as a write transition status. The Write2Read state SB5 is also referred to as a read transition status.

The Read2Write state SB4 is a transition state from the Reading state SB3 to the Writing state SB2. The Read2Write state SB4 is a state where an Activate_for_Write command (to execute the Write command) is executed while the Read command is executed. The Write2Read state SB5 is a transition state from the Writing state SB2 to the Reading state SB3. The Write2Read state SB5 is a state where an Activate_for_Read command (to execute the Read command) is executed while the Write command is executed.

Figure 19:
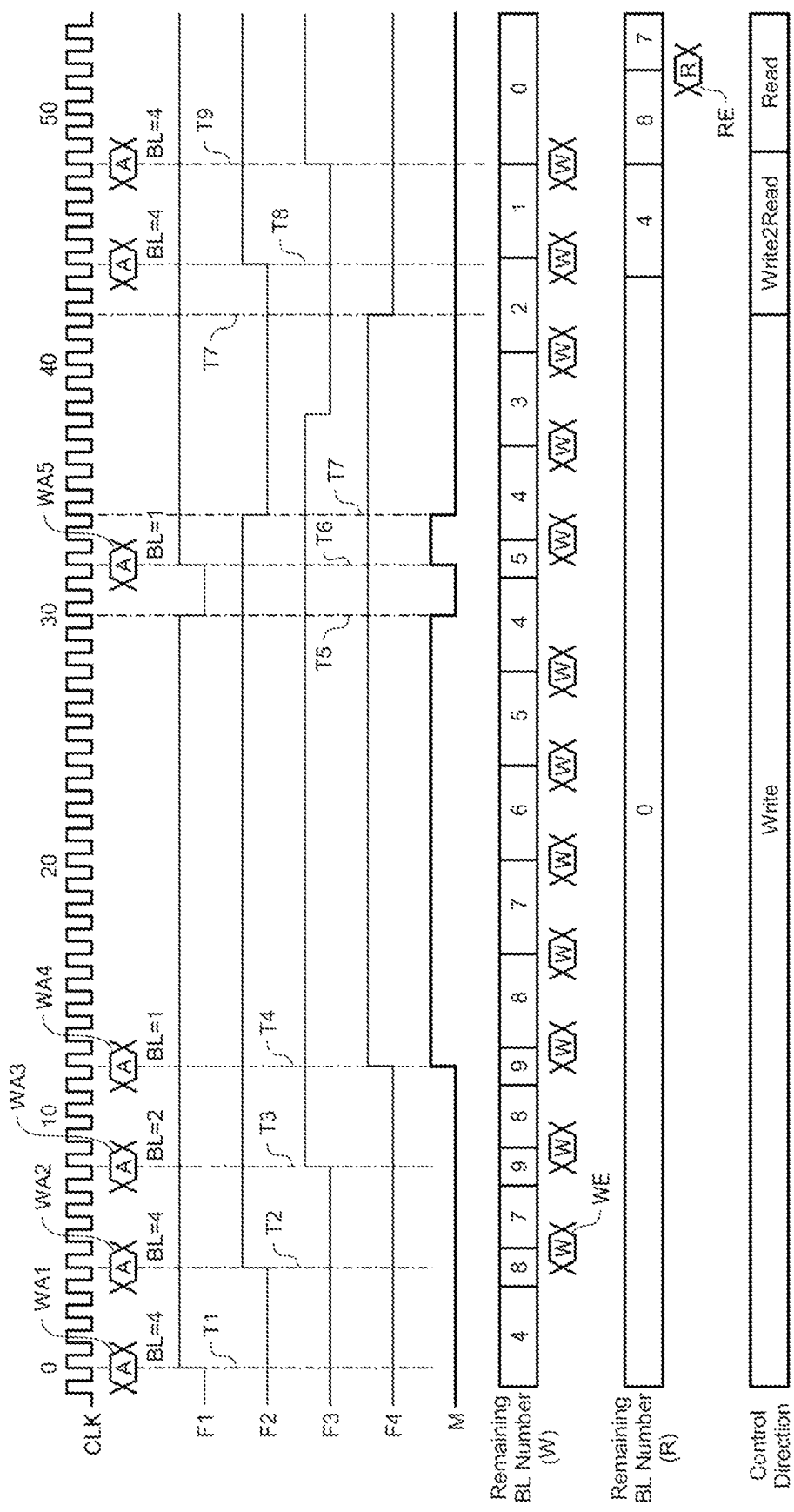
FIG. 19 is a timing chart illustrating a content of a tFAW delay according to the second embodiment.

FIG. 19 is a timing chart illustrating a content of a tFAW delay according to the second embodiment. The Four Activate Window delay (tFAW delay) is one of inter-bank timing constraints important for ensuring the high efficiency memory control. The tFAW delay defines a period for which four activations are allowed to exist. The tFAW delay is defined such that an electric power consumption in Activate does not adversely affect a function of an SDRAM Device. The memory control can restrict the frequency of Activate within a certain period with the tFAW delay. Assume that, in this example, the period of the tFAW delay is set to 30 clocks.

A clock CLK indicates a control clock of the memory control unit 60. The tFAW managing unit 6234T1 of the inter-bank control unit 6234a includes four flags FL1 to FL4. The BL information managing unit 6234T2 manages BL information, that is, a remaining BL number, which means a remaining number of the number of bursts. The remaining BL number includes a remaining write BL number (remaining BL number (W)) and a read remaining BL number (remaining BL number (R)). The mask processing unit 6234T3 sets a mask flag M based on the four flags FL1 to FL4 to mask (restrict) Activate based on the mask flag M. The inter-bank arbitration unit 6234T4 manages the control direction status.

The memory control unit 60 executes an Activate_for_Write command WA1 at a time T1 (clock 0). In response to this, the tFAW managing unit 6234T1 sets the first flag FL1 at the time T1 for a predetermined period (in this example, 30 clocks as the period of the tFAW delay). Next, the memory control unit 60 executes an Activate_for_Write command WA2 at a time T2 (clock 4). In response to this, the tFAW managing unit 6234T1 sets the second flag FL2 at the time T2. Furthermore, after that, the memory control unit 60 executes an Activate_for_Write command WA3 at a time T3 (clock 8). In response to this, the tFAW managing unit 6234T1 sets the third flag FL3 at the time T3.

The memory control unit 60 executes an Activate_for_Write command WA4 at a time T4 (clock 12). In response to this, the tFAW managing unit 6234T1 sets the fourth flag FL4 at the time T4. Since all the four flags FL1 to FL4 have been set, the mask processing unit 6234T3 sets the mask flag M. Since the mask flag M has been set, the mask processing unit 6234T3 restricts (inhibits) Activate.

The memory control unit 60 puts the first flag FL1 down at a time T5 (clock 30). This is because the predetermined period (30 clocks as the period of the tFAW delay) has elapsed from the time T1 (clock 0). This causes the mask processing unit 6234T3 to put the mask flag M down at the time T5 to enable Activate.

The memory control unit 60 executes the Activate_for_Write command WA2 at a time T6 (clock 32). In response to this, the tFAW managing unit 6234T1 sets the first flag FL1 again at the time T6. Since all the four flags FL1 to FL4 have been set, the mask processing unit 6234T3 sets the mask flag M. Since the mask flag M has been set, the mask processing unit 6234T3 restricts (inhibits) Activate until a time T7 at which the second flag FL2 is put down. This enables the memory control unit 60 to prevent the electric power consumption in Activate from adversely affecting the function of the SDRAM Device.

Meanwhile, the BL information managing unit 6234T2 updates a remaining write BL number as a remaining number of the number of write bursts. The BL information managing unit 6234T2 updates the remaining write BL number based on the BL information related to the Activate_for_Write command WA1 at the time T1. Since, in this example, the BL information is BL=4, the BL information managing unit 6234T2 adds four to the remaining write BL number to set the remaining write BL number to "4." Next, the BL information managing unit 6234T2 updates the remaining write BL number to "8" based on the BL information (BL=4) related to the Activate_for_Write command WA2 at the time T2.

Meanwhile, every time the Write command is executed, the BL information managing unit 6234T2 decrements the remaining write BL number by "1" (subtract "1" from the remaining write BL number) to update the remaining write BL number to "7." This enables the BL information managing unit 6234T2 to manage a remaining number of the number of bursts to be processed without Activate at an actual time.

Figure 20:
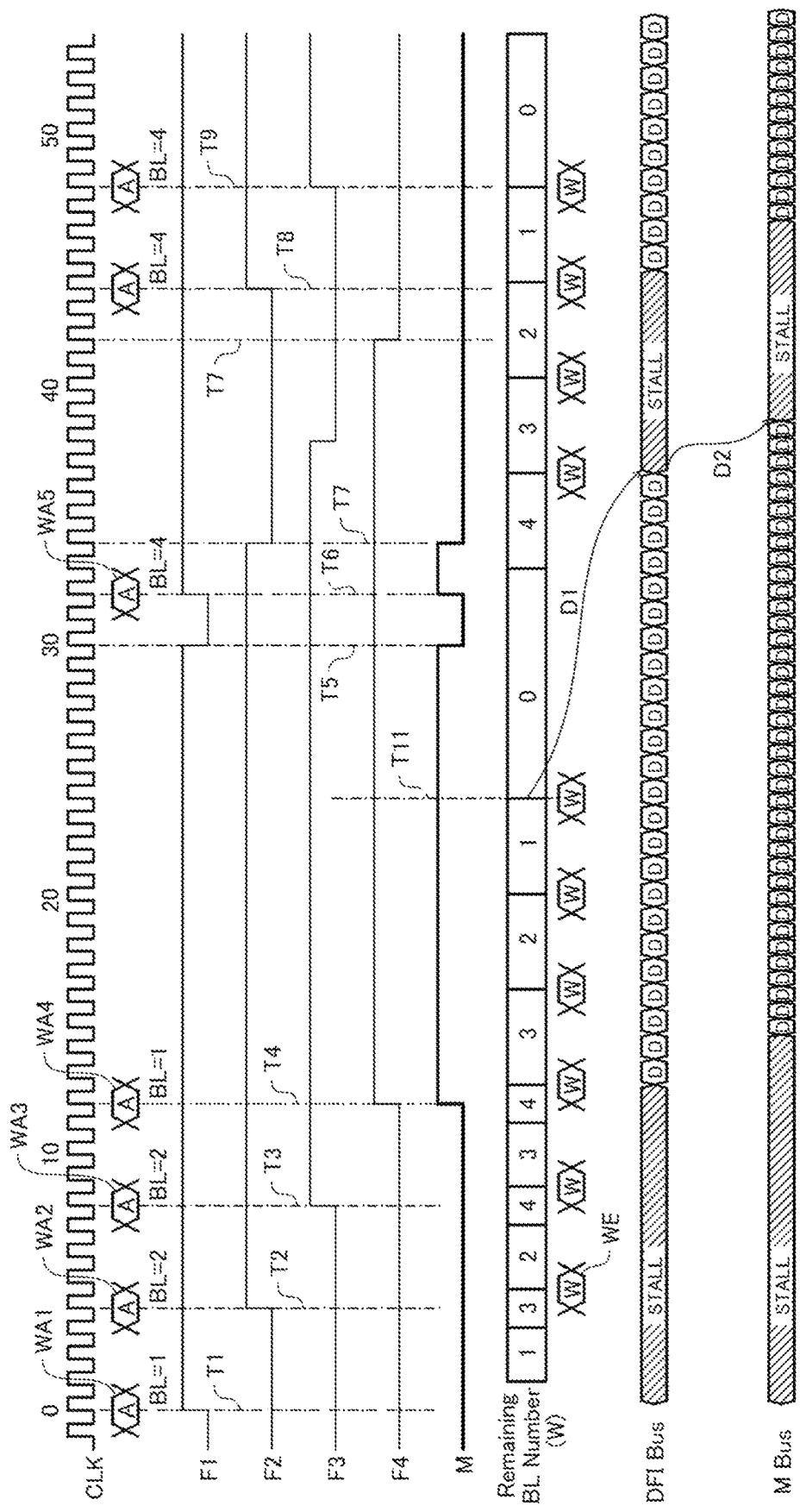
FIG. 20 is a timing chart illustrating data bus stalls due to the tFAW delay according to a second embodiment.

FIG. 20 is a timing chart illustrating data bus stalls due to the tFAW delay according to the second embodiment. FIG. 20 indicates a case where the BL counts related to Activate_for_Write commands WA1 to WA4 are small in the example of FIG. 19.

In this example, at the time T11, the memory control unit 60 has the BL count of zero and has no write data left for the DDR physical interface 80 to send. Because any additional Activate_for_Write command W is inhibited from issuing until the time T6 in the time period of tFAW delay.

Thus, after the memory control unit 60 transmits the write data, which is transmitted by execution of the last write command, to the data bus, that is, after a lapse of a delay of D1, a stall occurs in the DDR PHY Interface (DFI) bus between the memory control unit 60 and the DDR physical interface 80. Further, the stall of the DDR physical interface 80 is followed by a stall of the memory bus (M bus) after a lapse of a delay of D2.

The inventor focused on the small burst count of the write data, which is related to the Activate_for_Write command selected at the time T4, and created a new inter-bank arbitration. This arbitration focuses on the remaining burst count and is an intelligent method that selects the Activate_for_Write or the Activate_for_Read related to a writing or a reading with a large burst count as the arbitration result when the remaining burst count become small. Specifically, if the memory control unit 60 performed an intelligent method at the time T4 and selects the Activate_for_Write related to data with a relatively large burst count (such as 7 or 8), the stalls in the DDR PHY Interface bus and the memory bus would have been reduced or avoided.

FIG. 20 is a flowchart illustrating a content of a request pickup processing (Step S40a) according to the second embodiment. The request pickup processing (Step S40a) according to the second embodiment is different from the request pickup processing (Step S40) according to the one embodiment in that the write request pickup processing (Step S44) and the read request pickup processing (Step S45) are changed to a write request pickup processing (Step S44a) and a read request pickup processing (Step S45a).

Figure 21:
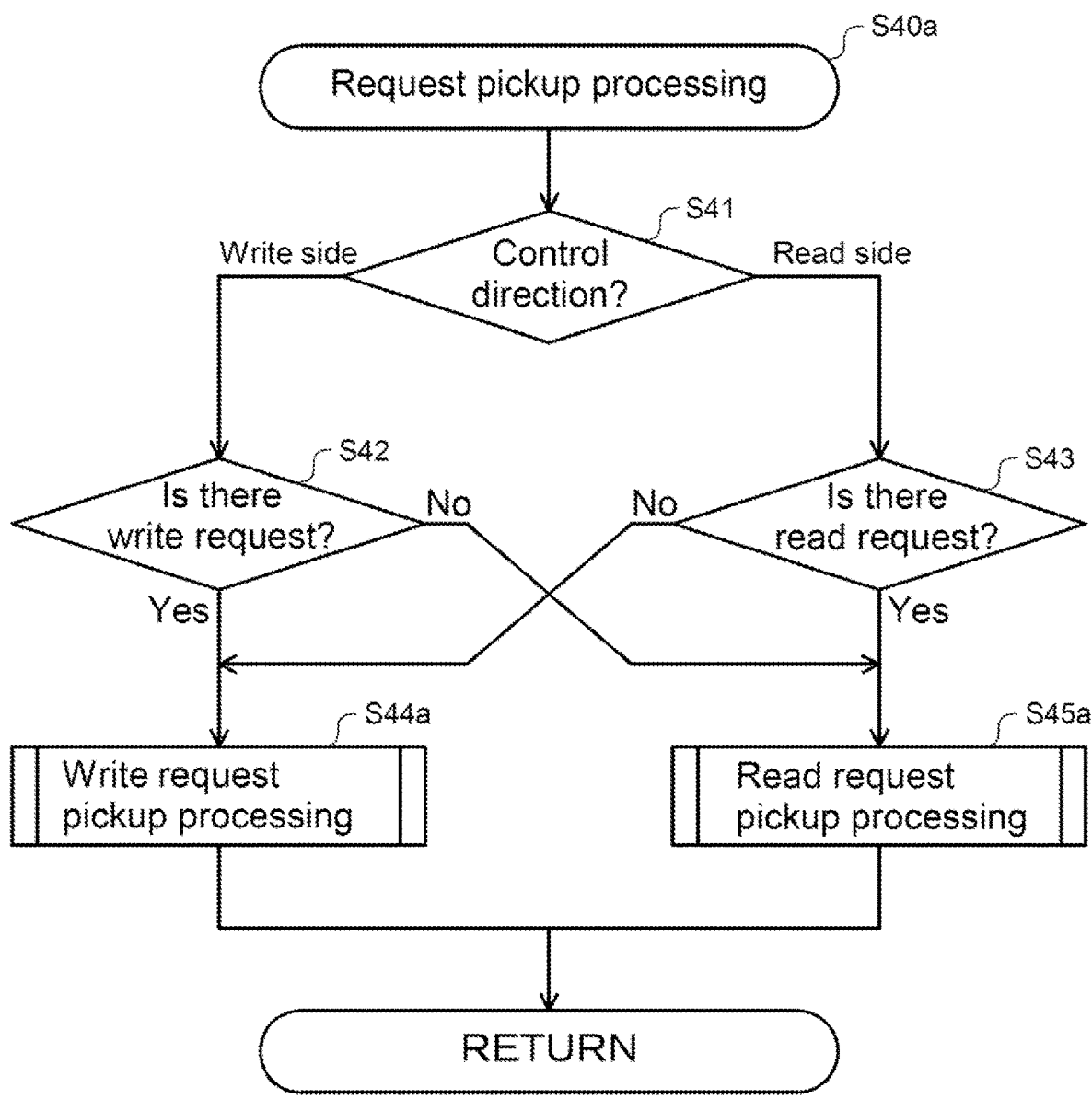
FIG. 21 is a flowchart illustrating a content of a request pickup processing according to the second embodiment.
Figure 22A:
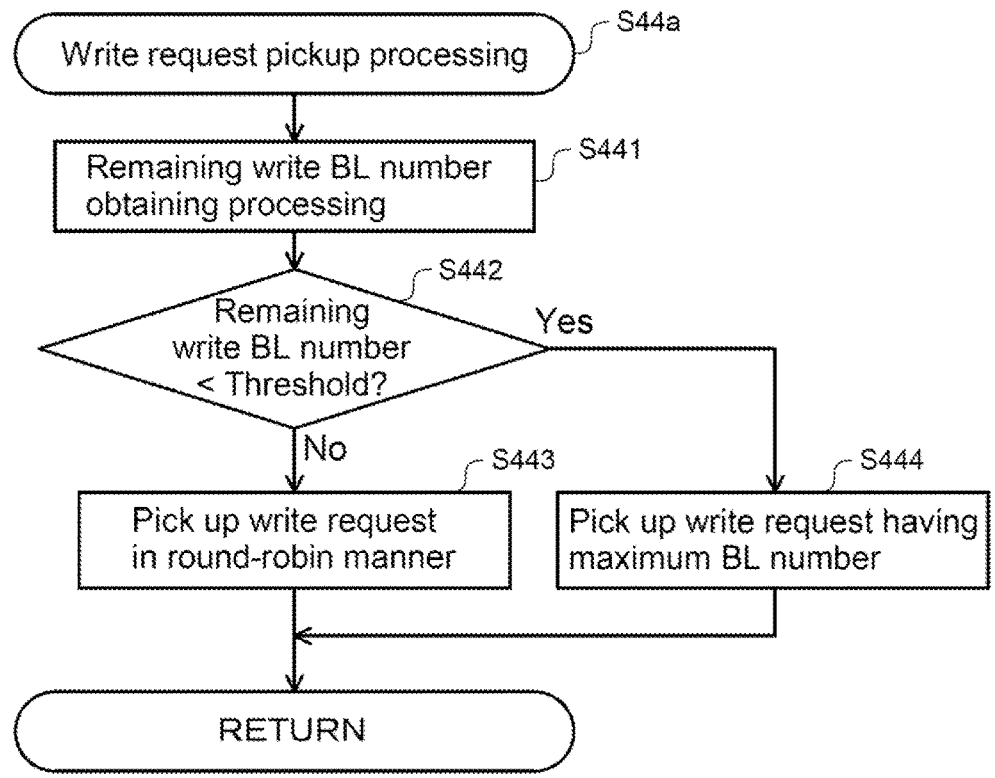
FIG. 22A and FIG. 22B are flowcharts illustrating contents of a write request pickup processing (Step S44a) and a read request pickup processing (Step S45a) according to the second embodiment.
Figure 22B:
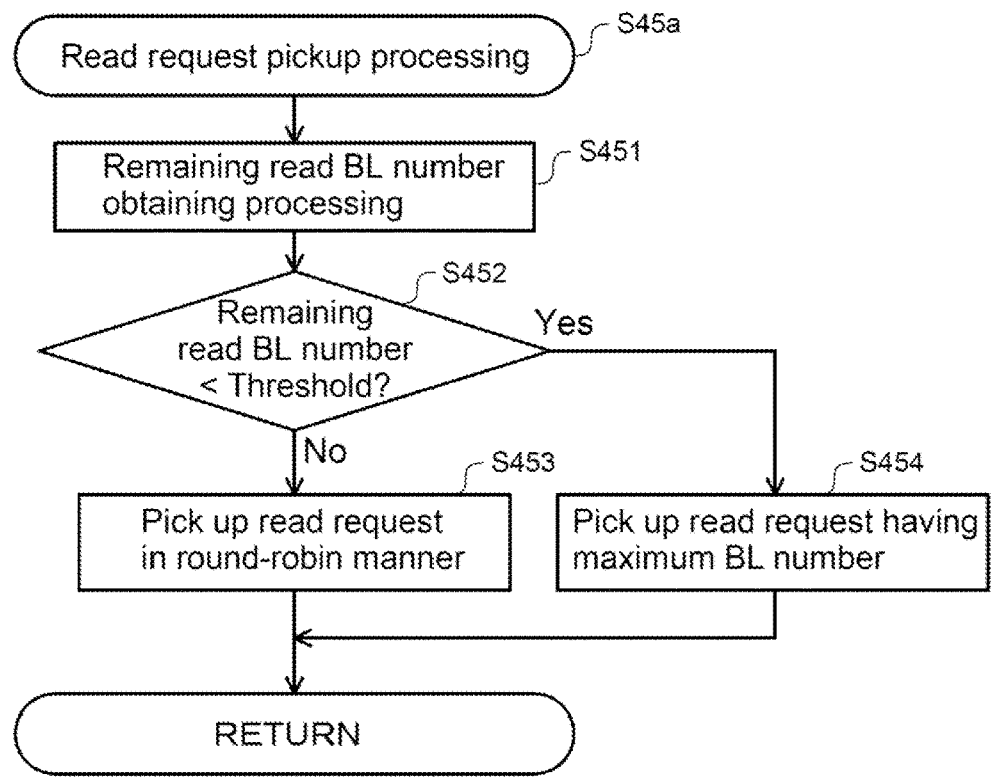

FIG. 21A and FIG. 21B are flowcharts illustrating contents of the write request pickup processing (Step S44a) and the read request pickup processing (Step S45a) according to the second embodiment. FIG. 21A is the flowchart illustrating the content of the write request pickup processing (Step S44a). FIG. 21B is the flowchart illustrating the content of the read request pickup processing (Step S45a). The read request pickup processing (Step S45a) is a processing identical to the write request pickup processing (Step S44a) except that a request as a processing target is not the write request but the read request. Thus, the following describes only the write request pickup processing (Step S44a).

At Step S441, the inter-bank arbitration unit 6234T4 executes a remaining write BL number obtaining processing. In the remaining write BL number obtaining processing, the inter-bank arbitration unit 6234T4 obtains the remaining write BL number as a remaining number of the number of write bursts from the BL information managing unit 6234T2.

At Step S442, the inter-bank arbitration unit 6234T4 compares the remaining write BL number with the preliminarily set predetermined threshold to determine whether the remaining write BL number is less than the predetermined threshold or not. The inter-bank arbitration unit 6234T4 advances the process to Step S444 when the remaining write BL number is less than the predetermined threshold. The inter-bank arbitration unit 6234T4 advances the process to Step S443 when the remaining write BL number is equal to or more than the predetermined threshold.

At Step S443, the inter-bank arbitration unit 6234T4 picks up the write request in a round-robin manner. Thus, the inter-bank arbitration unit 6234T4 reduces the accumulation of a specific write request to ensure the smooth arbitration.

At Step S444, the inter-bank arbitration unit 6234T4 picks up the write request having the maximum BL number. This enables the inter-bank arbitration unit 6234T4 to reduce the possibility that the number of bursts of the processing target becomes zero to stop the write processing when the remaining write BL number is less than the predetermined threshold, that is, when the tFAW delay restricts Activate. The predetermined threshold can be determined by analysis and simulation as a trade-off of the possibility of the write processing stop and the accumulation of the write request having a small BL number.

This enables the memory control unit 60 according to the second embodiment to prevent the performance deterioration caused by the tFAW delay, thus ensuring the efficient arbitration.

G. Modification

The disclosure can be executed not only in the respective embodiments described above but also in the following modifications.

Modification 1

While, in the above-described embodiment, the AXI protocol is used and the QOS value is supported based on the AXI protocol, the use of the AXI protocol is not necessarily required and other communication priority data that represents a priority of communication may be used instead of the QOS value. In the disclosure, it is only necessary that a prioritized processing is executed by using the communication priority data that represents the priority of communication with the units outside the memory control unit.

Modification 2

While, in the above-described embodiment, the DCV value that represents the priority of the processing in the memory control is generated by using the communication priority data (for example, the QOS value) that represents the priority of communication with the units outside the memory control unit, it is not necessarily required to generate the DCV value by using the communication priority data. In the disclosure, it is only necessary that the processing priority data (for example, the initial values are identical) that is used to execute the interrupt processing is generated.

Modification 3

While, in the above-described embodiment, the DCV value is generated by using the communication priority data, the communication priority data may be conversely adjusted based on the DCV value. Specifically, the communication control unit may be configured so as to change the QOS value of the transaction T, which has, for example, the DCV value less than the threshold, for example, from "2" to "0," namely to enhance the priority in communication corresponding to the DCV value. This enables the image forming apparatus to reduce processing delay of the whole system caused by long-time accumulation at the memory control unit.

Modification 4

While, in the above-described embodiment, the disclosure is applied to the image forming apparatus that includes the image reading unit and the image forming unit, it may be applied to an image forming apparatus that includes an image transmitting unit and has a facsimile function serving as an image transmitting apparatus. The facsimile function includes a function of reading image data as a communication target from a memory and transmitting it.

Modification 5

While, in the above-described embodiment, the disclosure is applied to the image forming apparatus, it is not limited to the image forming apparatus. The disclosure is also applicable to a memory control apparatus that controls a memory used for an apparatus other than the image forming apparatus.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An image forming method comprising:
controlling a memory by,
receiving a write request data set and a read request data set, the write request data set including write data and requesting writing of data into the memory, the read request data set requesting reading of data from the memory, the write request data set and the read request data set each including communication priority data that represents a priority of communication, and transmitting read data that is read corresponding to the read request,
dividing a write destination of the write data for respective predetermined areas in the memory and attaching transfer IDs to generate write control data for the respective predetermined areas by using the write request data set, and dividing a read destination of the read data for respective predetermined areas and attaching transfer IDs to generate read control data for the respective predetermined areas by using the read request data set;
storing the write data temporarily in a write buffer,
storing the write control data and the read control data in an arbitration queue,
executing an arbitration that determines a priority order of processing taking the write control data and the read control data that are stored in the arbitration queue as targets,
writing the write data stored in the write buffer into the memory by using the write control data selected based on the priority order, and generating a command to temporarily store read data read from the memory in a read buffer by using the read control data selected based on the priority order, and
adding a burst number of a Read command or a Write command to complete a transaction in response to an execution of an Activate command to execute the transaction while decrementing a burst number in response to an execution of the Read command or the Write command, so as to update a remaining burst number as a remaining number of bursts, wherein
the arbitration raises a priority order of the Activate command to execute the transaction having a large burst number when the remaining burst number is less than a preliminarily set threshold;
reading the pixel data from the memory by using the read request data set that includes the communication priority data, the pixel data representing a dot formation state formed by use of color materials; and
forming an image on a print medium by use of the pixel data read from the memory.

2. The image forming method according to claim 1, wherein the arbitration selects the Activate command to execute the transaction having the largest burst number when the remaining burst number is less than a preliminarily set threshold.

3. The image forming method according to claim 1, further comprising:
generating processing priority data that represents a priority of processing in controlling the memory; and
changing the processing priority data every time a predetermined time elapses; wherein
the control data is generated by dividing a write destination of the write data for respective predetermined areas in the memory and attaching the processing priority data and transfer IDs to generate write control data for the respective predetermined areas by using the write request data set and the processing priority data, and dividing a read destination of the read data for respective predetermined areas and attaching the processing priority data and transfer IDs to generate read control data for the respective predetermined areas by using the read request data set and the processing priority data,
the arbitration raises a priority order taking the write control data or the read control data that includes the processing priority data as a timeout request when the processing priority data has passed a preliminarily set threshold by the change, and the arbitration selects the Activate command to execute the transaction having the largest burst number in the timeout request when the remaining burst number is less than a preliminarily set threshold.

4. The image forming method according to claim 3, wherein:
the write request data set and the read request data set include communication priority data that represents a priority of communication; and
the processing priority data is generated by using the communication priority data.

5. An image reading method comprising:
generating image data by reading an image; and
writing the generated image data into the memory by using the write request data set that includes the communication priority data, in the image forming method according to claim 4.

6. An image transmitting method comprising:
reading image data as a communication target from the memory by using the read request data set that includes the communication priority data, in the image forming method according to claim 4; and transmitting an image by using the image data.

7. The image forming method according to claim 1, wherein the memory has a plurality of banks, and the predetermined area is a row in any one bank among the plurality of banks.

8. The image forming method according to claim 7, further comprising:
- detecting overlap access request data that is a write request data set or a read request data set that requests an access to an address that is at least partially overlapping an address of a write destination of received write request data set or a read destination of received read request data set; and
- identifying the bank among the plurality of banks where the overlap access request data requests the access; wherein the arbitration stops the arbitration of the identified bank.

9. An image forming apparatus comprising:
- a processor;
- a memory;
- a memory control apparatus for controlling the memory, the memory control apparatus including a processor configured to function as
- a transmitting/receiving unit that receives a write request data set and a read request data set, the write request data set including write data and requesting writing of data into the memory, the read request data set requesting reading of data from the memory, the write request data set and the read request data set each including communication priority data that represents a priority of communication, and that transmits read data that is read corresponding to the read request,
- a data processor that divides a write destination of the write data for respective predetermined areas in the memory and attaches transfer IDs to generate write control data for the respective predetermined areas by using the write request data set, and divides a read destination of the read data for respective predetermined areas and attaches transfer IDs to generate read control data for the respective predetermined areas by using the read request data set,
- a write buffer that temporarily stores the write data,
- an arbitration queue that stores the write control data and the read control data,
- an arbitration unit that executes an arbitration that determines a priority order of processing taking the write control data and the read control data that are stored in the arbitration queue as targets,
- a command generating unit that writes the write data stored in the write buffer into the memory by using the write control data selected based on the priority order, and generates a command to temporarily store read data read from the memory in a read buffer by using the read control data selected based on the priority order, and
- a remaining burst number managing unit that adds a burst number of a Read command or a Write command to complete a transaction in response to an execution of an Activate command to execute the transaction, and decrements a burst number in response to an execution of the Read command or the Write command, so as to update a remaining burst number as a remaining number of bursts, wherein the arbitration unit raises a priority order of the Activate command to execute the transaction having a large burst number when the remaining burst number is less than a preliminarily set threshold; and an image exposure/development/fixing unit that forms an image on a print medium by using pixel data representing a dot formation state formed by use of a color material, the image exposure/development/fixinq unit reading the pixel data from the memory by using the read request data set that includes the communication priority data.

10. The image forming apparatus according to claim 9, wherein the arbitration unit selects the Activate command to execute the transaction having the largest burst number when the remaining burst number is less than a preliminarily set threshold.

11. The image forming apparatus according to claim 9 further comprising:
- a processing priority data generating unit that generates processing priority data that represents a priority of processing in controlling the memory; and
- a change processing unit that changes the processing priority data every time a predetermined time elapses; wherein the data processor divides a write destination of the write data for respective predetermined areas in the memory and attaches the processing priority data and transfer IDs to generate write control data for the respective predetermined areas by using the write request data set and the processing priority data, and divides a read destination of the read data for respective predetermined areas and attaches the processing priority data and transfer IDs to generate read control data for the respective predetermined areas by using the read request data set and the processing priority data, the arbitration unit raises a priority order taking the write control data or the read control data that includes the processing priority data as a timeout request when the processing priority data has passed a preliminarily set threshold by the change, and the arbitration unit selects the Activate command to execute the transaction having the largest burst number in the timeout request when the remaining burst number is less than a preliminarily set threshold.

12. The image forming apparatus according to claim 11, wherein:
- the write request data set and the read request data set include communication priority data that represents a priority of communication; and
- the processing priority data is generated by using the communication priority data.

13. The image forming apparatus according to claim 9, wherein the memory has a plurality of banks, and the predetermined area is a row in any one bank among the plurality of banks.

14. The image forming apparatus according to claim 13, further comprising:
- an overlap address detecting unit that detects overlap access request data that is a write request data set or a read request data set that requests an access to an address that is at least partially overlapping an address of a write destination of received write request data set or a read destination of received read request data set, the overlap address detecting unit identifying the bank among the plurality of banks where the overlap access request data requests the access; wherein the arbitration unit stops the arbitration of the identified bank.

15. The image forming apparatus according to claim 9, further comprising:
   an image reading unit that generates image data by reading an image wherein
   the image reading unit writes the generated image data into the memory by using the write request data set that includes the communication priority data.

16. The image forming apparatus according to claim 9, further comprising:
   an image transmitting unit that transmits an image by using image data as a communication target; wherein
   the image transmitting unit reads the image data from the memory by using the read request data set that includes the communication priority data;
a facsimile unit that transmits an image by using image data as a communication target,
wherein the facsimile unit reads the image data from the memory by using the read request data set that includes the communication priority data.

* * * * *